US010402503B2

(12) United States Patent
Shapiro et al.

(10) Patent No.: US 10,402,503 B2
(45) Date of Patent: Sep. 3, 2019

(54) METHOD AND SYSTEM FOR DESIGNING A COMMON END EFFECTOR FOR A ROBOT WHICH IS CAPABLE OF GRASPING PLURALITY OF PARTS, EACH HAVING ITS OWN GEOMETRY

(71) Applicant: Ben-Gurion University of the Negev Research & Development Authority, Beer Sheva (IL)

(72) Inventors: Amir Shapiro, Metar (IL); Avishai Sintov, Beer Sheva (IL)

(73) Assignee: BEN-GURION UNIVERSITY OF THE NEGEV & DEVELOPMENT AUTHORITY, Beer Sheva (IL)

( * ) Notice: Subject to any disclaimer, the term of this patent is extended or adjusted under 35 U.S.C. 154(b) by 601 days.

(21) Appl. No.: 14/427,688

(22) PCT Filed: Sep. 11, 2013

(86) PCT No.: PCT/IL2013/050767
§ 371 (c)(1),
(2) Date: Mar. 12, 2015

(87) PCT Pub. No.: WO2014/041538
PCT Pub. Date: Mar. 20, 2014

(65) Prior Publication Data
US 2015/0242540 A1   Aug. 27, 2015

Related U.S. Application Data

(60) Provisional application No. 61/700,346, filed on Sep. 13, 2012.

(51) Int. Cl.
G06G 7/48 (2006.01)
G06F 17/50 (2006.01)
(Continued)

(52) U.S. Cl.
CPC ............ *G06F 17/50* (2013.01); *B25J 19/007* (2013.01); *G06F 17/10* (2013.01); *G06T 17/205* (2013.01); *G06T 2210/36* (2013.01)

(58) Field of Classification Search
None
See application file for complete search history.

(56) References Cited

U.S. PATENT DOCUMENTS

2006/0012198 A1*  1/2006  Hager .................. B25J 15/0009
                                                    294/106
2006/0250401 A1   11/2006  Pannese et al.

OTHER PUBLICATIONS

"A new solution to design polyvalent gripper systems for industrial applications". ©1994 IEEE.*
(Continued)

*Primary Examiner* — Aniss Chad
*Assistant Examiner* — Nithya J. Moll
(74) *Attorney, Agent, or Firm* — Kinney & Lange, P.A.

(57) ABSTRACT

The invention relates to a method for determining a grasp set of n gripping points for a common end effector of a robot, said end effector being used for grasping a plurality of parts, each part having its own geometry, the method comprises: (a) providing said plurality of parts in a CAD form; (b) meshing each of said parts; (c) determining for each of said parts all the possible grasps that are capable of holding the respective part by any k-contacts points end effector; (d) calculating a quality measure for each of said determined grasps; (e) calculating an allowable range for said calculated quality measures; (f) for each part, parametrizing each of its grasps that are found to be within said allowable range, by a feature vector; (g) performing a cross-part intersection between said grasps that are found to be within said allowable range, and determining those grasps that are intersected between parts; and (h) from among said intersected grasps,
(Continued)

selecting a single grasp having a highest quality measure, said selected grasp is used for grasping said plurality of parts by said end effector.

9 Claims, 16 Drawing Sheets

(51) Int. Cl.
*B25J 19/00* (2006.01)
*G06T 17/20* (2006.01)
*G06F 17/10* (2006.01)

(56) References Cited

OTHER PUBLICATIONS

Chang, Lillian, Joshua R. Smith, and Dieter Fox. "Interactive singulation of objects from a pile." Robotics and Automation (ICRA), 2012 IEEE International Conference on. IEEE, 2012.*

Bajaj, Chandrajit L., and Daniel R. Schikore. "Error-bounded reduction of triangle meshes with multivariate data." Electronic Imaging: Science & Technology. International Society for Optics and Photonics, 1996.*

Coelho, Jefferson, Justus Piater, and Roderic Grupen. "Developing haptic and visual perceptual categories for reaching and grasping with a humanoid robot." Robotics and Autonomous Systems 37.2 (2001): 195-218.*

International Search Report dated Jan. 6, 2014 for PCT/IL2013/050767.

Avishai Sintov, Srinivas Raghothama, Roland Menassa and Amir Shapiro, "A Common 3-finger grasp Search Algorithm for a Set of Planar Objects", Aug. 24, 2012.

Avishai Sintov, Roland Menassa and Amir Shapiro, "A Common n-finger grasp Search Algorithm for a Set of 3D Objects", Dec. 31, 2012.

Maximo Roa and Raul Suarez, "Frictionless grasp with 7 fingers on discretized 3D objects" Jun. 30, 2006.

A. Sahbani, S. El-Khoury and P. Bidaud, "An Overview of 3D Object Grasp Synthesis Algorithms", UPMC Univ Paris 06, Sep. 12, 2012.

\* cited by examiner

|  | Vertices | | |
|---|---|---|---|
| $t_1$: | 1 | 2 | 3 |
| $t_2$: | 1 | 2 | 5 |
| $t_3$: | 1 | 3 | 4 |
| $t_4$: | 1 | 4 | 5 |
| $t_5$: | 2 | 3 | 4 |
| $t_6$: | 2 | 4 | 5 |

Fig. 3b

|  | Adj. Triangles | | |
|---|---|---|---|
| $t_1$: | $t_2$ | $t_3$ | $t_5$ |
| $t_2$: | $t_1$ | $t_4$ | $t_6$ |
| $t_3$: | $t_1$ | $t_4$ | $t_5$ |
| $t_4$: | $t_2$ | $t_3$ | $t_6$ |
| $t_5$: | $t_1$ | $t_3$ | $t_6$ |
| $t_6$: | $t_2$ | $t_4$ | $t_5$ |

Fig. 3c

METHOD AND SYSTEM FOR DESIGNING A COMMON END EFFECTOR FOR A ROBOT WHICH IS CAPABLE OF GRASPING PLURALITY OF PARTS, EACH HAVING ITS OWN GEOMETRY

FIELD OF THE INVENTION

The invention relates in general to the field of robots. More particularly, the invention relates to a method for designing a common end effector for a robotic arm, which is capable of grasping plurality of parts, each having its own shape geometry.

BACKGROUND OF THE INVENTION

In the industry of today, a mass production in assembly lines and manufacturing plants relies on robotics and automation lines. Robot arms that are equipped with end-effectors are key components to carry out myriad number of critical automation tasks such as material handling, paint operations, assembling, etc. A typical robot comprises one or more arms, each arm being in turn provided with an end effector. An end effector is a structure on which one or more grippers are provided at specific locations, for gripping and manipulating the respective part.

Typically, each robotic end-effector of the prior art is designed, built and optimized to carry out specific actions on a specific part. This makes them very inflexible in terms of variations of objects and tasks. Current automatic solutions to enhance the flexibility of robots involve either the adding of active elements to end-effectors in order to adapt them to different parts geometries, or simply providing additional end-effectors in proximity of the robot that can be replaced via a robot-interface plate. These solutions require, however, more factory space, and thus they are very costly. The design, build and testing phases of a typical end-effector consume considerable amounts of engineering times, and add additional costs to the final products.

It is therefore an object of the present invention to provide a method for designing an end effector which is common for handling plurality of parts, each having its own geometry.

It is still another object of the present invention to provide such an end effector design which is more efficient and reliable compared to existing design methods.

It is still another object of the present invention to provide an end effector design which enables a significant saving production time and space.

It is still another object of the present invention to enable a significant reduction in the costs of various final products.

Other objects and advantages of the present invention will become apparent as the description proceeds.

SUMMARY OF THE INVENTION

The invention relates to a method for determining a grasp set of n gripping points for a common end effector of a robot, said end effector being used for grasping a plurality of parts, each part having its own geometry, the method comprises: (a) providing said plurality of parts in a CAD form; (b) meshing each of said parts; (c) determining for each of said parts all the possible grasps that are capable of holding the respective part by any k-contacts points end effector; (d) calculating a quality measure for each of said determined grasps; (e) calculating an allowable range for said calculated quality measures; (f) for each part, parametrizing each of its grasps that are found to be within said allowable range, by a feature vector; (g) performing a cross-part intersection between said grasps that are found to be within said allowable range, and determining those grasps that are intersected between parts; and (h) from among said intersected grasps, selecting a single grasp having a highest quality measure, said selected grasp is used for grasping said plurality of parts by said end effector.

Preferably, the method further comprises a step of meshing reduction, which reduces the mesh to edges regions within each part respectively.

Preferably, said mesh reduction also involves definition of forbidden zones.

Preferably, said calculation of the allowable range is performed by means of a distribution graph.

Preferably, each of said feature vectors comprises $5n-6$ elements for an n-points grasp.

Preferably, when said intersection step results in a null number of grasps, repeating the method for an increased number of gripping points $n=n+1$.

Preferably, each of said cross-part intersections is considered within a predefined range.

Preferably, said quality measure relies on the distribution of the projection of the gripping points on a plane fitted to these points, while the quality measure is defined as an area of a convex polygon formed by said projection.

Preferably, a larger area defines a higher quality measure and a better grasp.

Preferably, if no common grasp is found for all said plurality of parts, classifying the parts, and applying plurality of common grasps, each grasp to a specific class of parts.

BRIEF DESCRIPTION OF THE DRAWINGS

In the drawings:

FIG. 3b shows a triangles table K, which summarizes the results of the triangulation step, namely, triplets of vertices respectively for each of the triangles that form the polytope of FIG. 3a;

FIG. 3c shows an adjacency table Y, denoting for each triangle its adjacent triangles according to common vertices of the triangles of table K of FIG. 3b;

FIG. 7a shows an exemplary part with a full triangles mesh;

FIG. 7b shows an outcome of a mesh reduction algorithm as applied to the edges of the part of FIG. 7a;

DETAILED DESCRIPTION OF PREFERRED EMBODIMENTS

The present invention provides a method for finding an optimal configuration of a common end-effector which is capable of grasping given parts, each part having its own shape, which is different from the others. More specifically, the method of the invention teaches how to determine where and how to position the gripping points of the end effector, in a manner which is suitable for grasping all the said parts, one at a time.

Figure 13:
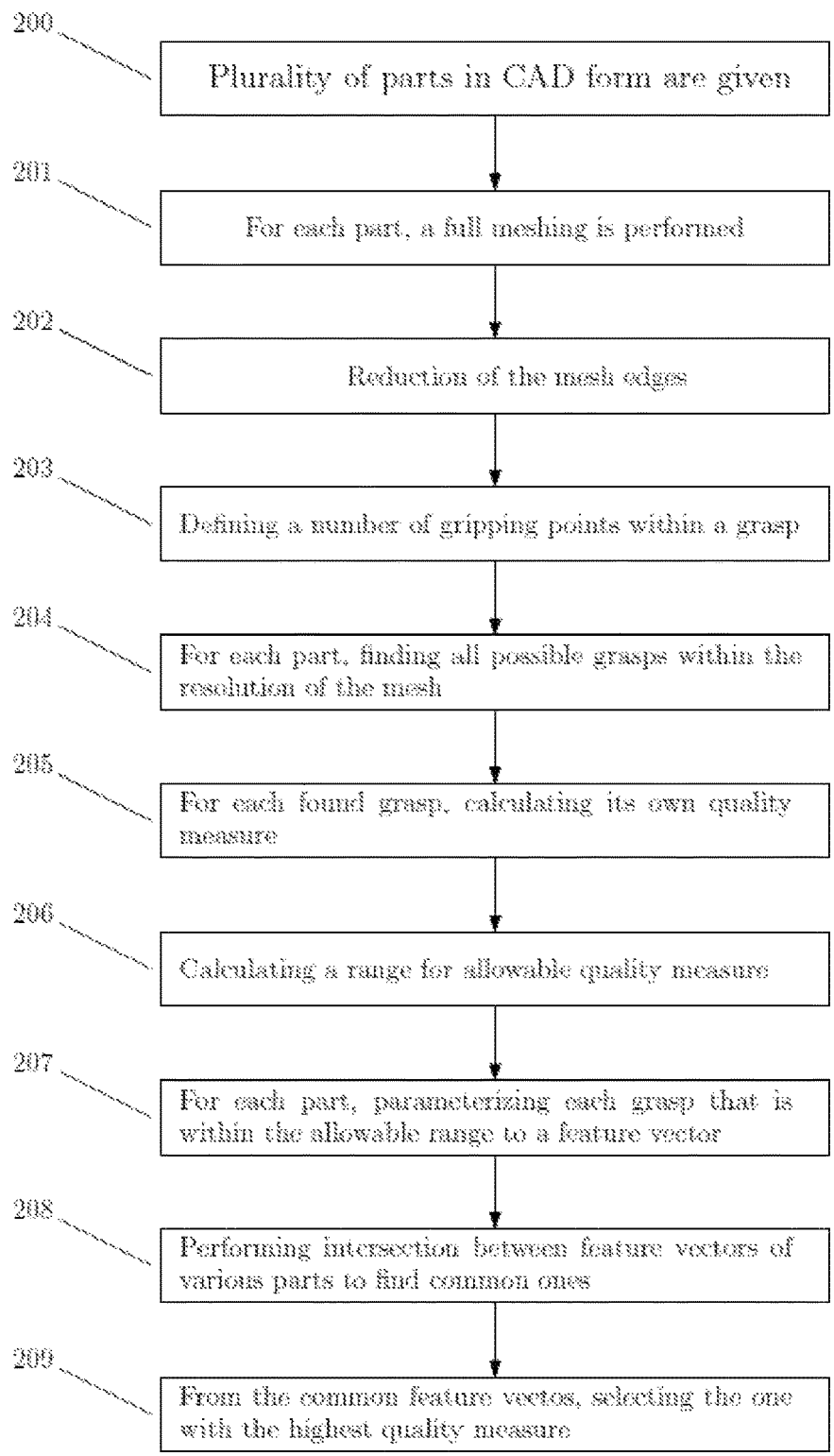
FIG. 13 shows a flow diagram, illustrating the method of the invention.

FIG. 13 generally describes the method of the present invention, in a flow diagram form. In step 200, a plurality of parts, each having its own shape are given in CAD form. As noted, the rest of the method teaches where and how on the common end effector to position gripping points that will enable grasping of all the given parts, one at time. In step 201, a meshing, preferably triangular meshing, is performed separately for each of the given parts. The meshing, which may cover the entire part, or most of it, is preferably significantly reduced in step 202 to cover only areas at edges of the part, while optionally also manually eliminating forbidden areas, as defined by the user. Alternatively, the meshing may be applied in step 201 intentionally only at the part edges, and in that case, the reduction procedure of step 202 may be superfluous. As will be further discussed in more details, the reduction of the meshing significantly reduces processing time by the method of the invention. In step 203, a number of gripping points n by each individual grasp is defined. This number in fact indicates the number of grippers that will be included within the end effector. In step 204, the procedure continues in determining, for each of the given parts, all the possible grasps for holding the part by the end effector (as noted, each grasp is in fact a combination of n number of gripping locations and force applying directions. In step 205, a quality measure is calculated for each possible grasp. In step 206, a range (lower and upper bounds) for allowable quality measures is calculated. This may be done, for example by means of a distribution graph. In step 207, for each part, the procedure continues by forming a feature vector for each grasp within the allowable range (i.e., each of said grasps is parameterized). In step 208, the procedure continues by performing intersection between feature vectors of various parts, thereby to find common ones (i.e., feature vectors that are common to all the parts). Finally, the method (procedure) terminates in step 209 by the selection of a single grasp having the highest quality measure.

Figure 14:
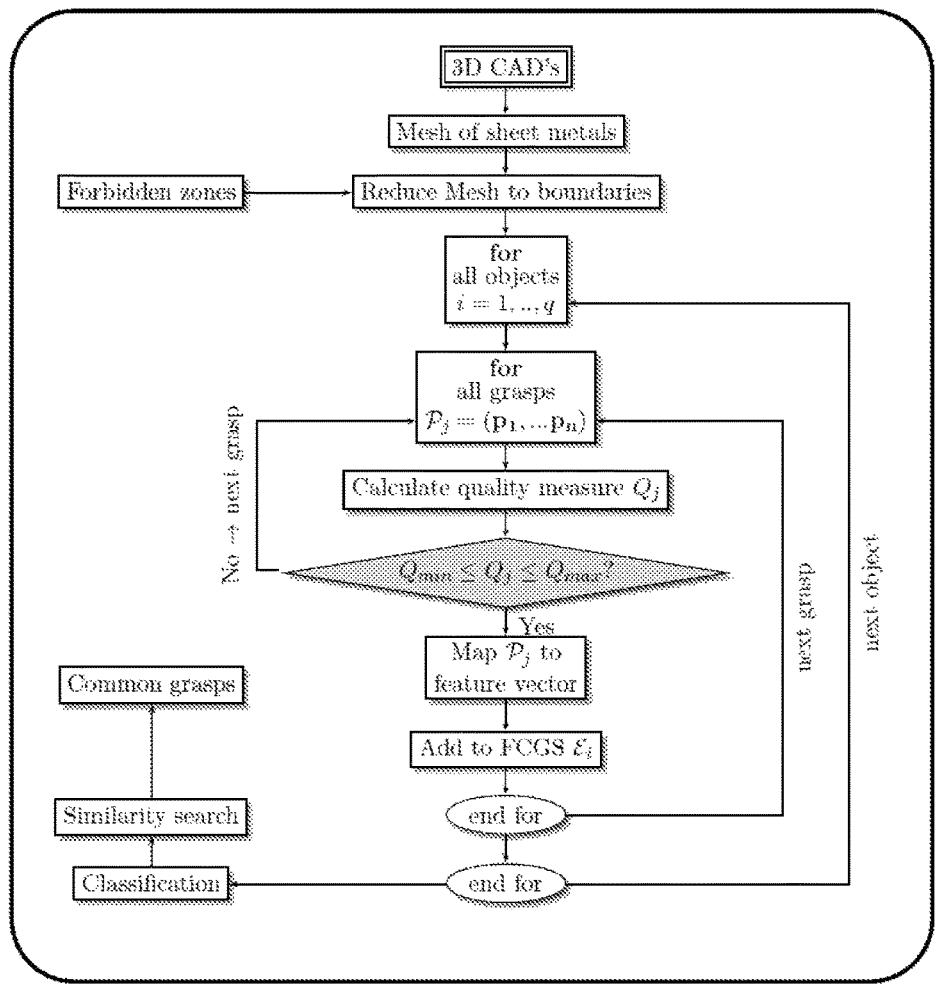
FIG. 14 in a describes the method of FIG. 13 in a logic representation form.

The above procedure of FIG. 13 is also provided in FIG. 14 in a logic representation form. Said procedure of FIG. 14 becomes clear by the following explanation.

The present invention provides a method for finding an optimal configuration of a simple end-effector which is capable of grasping a set of q sheets of metal parts. More specifically, given a set of q CAD models of the sheet metal parts (step 200 of FIG. 13), the invention provides a method for designing an end-effector which is common for the whole set of q parts, meaning that the common end effector is capable of holding a wide variety of parts, and is also capable of performing a wide variety of manipulations tasks on each of said parts. More specifically, the invention provides a novel method for designing a simple and flexible end-effector that can handle (grasp) a set of sheet metals, eliminating the need for providing a specific end effector for each part. As will be further discussed in more details below, the method of the present invention performs discretization of the given q parts, particularly their respective geometries, after defining forbidden grasping zones (based on operational demands) and it finds an optimal configuration for grasping them. In order to provide an end effector whose design is suitable for an industrial use, the method of the invention is particularly adapted to provide a feasible, simple, low cost configuration, namely a configuration having minimal degrees of freedom. A "feasible" configuration herein is a configuration which can stably grasp an object even under an application of external forces or torques, i.e., a so-called force-closure (Fo-C) grasp. The force-closure grasp can stably sustain forces, for example, due to a task which is done. The unique geometry of the sheet metal (the invention assumes that the q parts are three dimensional sheet metal parts), therefore the clamping for grasping according to the invention provides a constant force-closure grasp (under some assumptions), and therefore, there is no need for a frequent force closure check. However, as there are numerous possible grasps, the invention presents a novel quality criteria termed Projection Area Quality Measure (PAQM) which quantifies the grasp based on its spread across the sheet metal. The quality measure of the invention is based on an area of a polygon which is formed by the grasp points that are projected on a mean plane of the points. The quality measure of the invention enables filtering of unappropriate grasps.

As will be further shown, the method of the present invention parameterizes for each part all the possible force-closure grasps, and it uses this parameterization to classify the metal sheet parts with respect to these grasps. In a first stage of the process (i.e., method), a Force Closure Grasp Set (FCGS) is constructed for each part by sampling all the possible force-closure grasps, and then filtering out all those with low grasp quality measure. The possible grasps are represented as feature vectors in a high-dimensional space. Each feature vector is constructed in a unique form to injectively define the grasp invariant to any reference frame. The feature vector implies for the configuration of the end-effector based on the common grasp. The next step of the procedure is a "similarity join" step, which finds pairs of common feature vectors in the FCGS of all the objects. The similarity join stage is based on a search for a nearest-neighbor, and it finds, for each pair of FCGS sets, all those pairs of points that are within a predefined distance. The search for nearest-neighbor utilizes a binary tree representation of the high-dimensional space (termed kd-tree), and it performs an efficient search by reducing the number of inspections and by keeping the feature vectors sorted at each instance. The mean point of each pair that is found is then inserted into a registry set and associated to a possible FCGS. Finally, a classification stage is performed to determine those minimal feature vectors that cover the whole set of parts.

Figure 1:
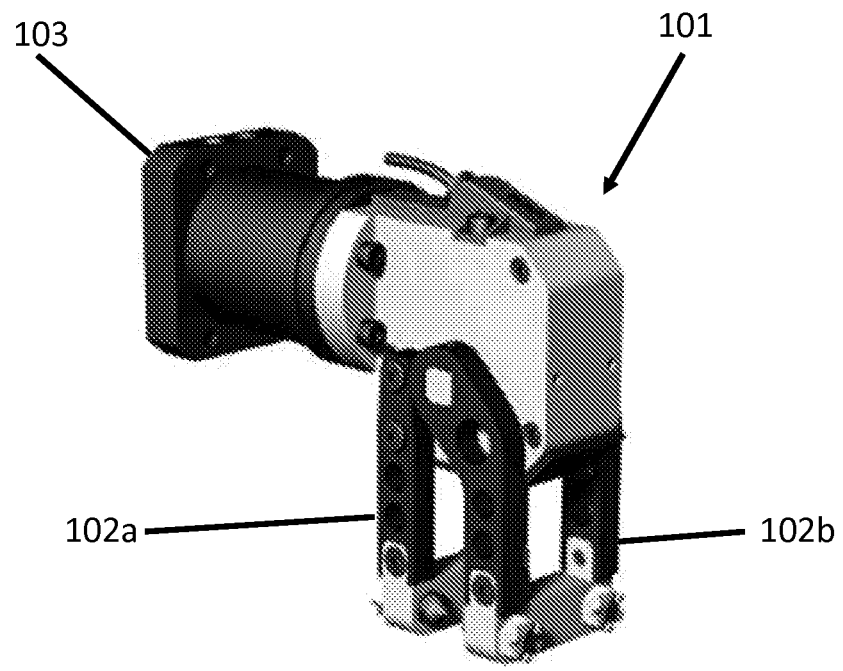
FIG. 1 shows a typical robot gripper.

Forces and torques can be represented as a wrench vector in the wrench space. A wrench is a 6-dimensional vector (in the case of 3D parts) and is denoted as $w=(f\,\tau)^T \in \mathbb{R}^6$ where $f \in \mathbb{R}^3$ is the force vector and $\tau \in \mathbb{R}^3$ is the torque vector. Furthermore, a wrench applied at a contact point, $p_i$, can be described as $w_i=(f\,p_i \times f_i)^T$ where $p_i$ is represented in the part coordinate frame. A friction which exists between the fingertips of the end-effector and the surface of the object can be represented by a simple Coulomb friction model $$\left| \sqrt{f_2^{i^2} + f_3^{i^2}} \right| \leq \mu f_1^i \quad (1)$$

where $f_1^i$ is the normal component, $f_2^i$ and $f_3^i$ are the tangential components of the contact point, and μ is the coefficient of friction. In this model, forces exerted in the contact point must lie within a cone which is centered about the normal of the surface. This is known as the Friction Cone (FC). The FC can be linearized with an s-sided convex cone and the force exerted within the FC can be represented by a linear combination of the unit vectors $\hat{f}_{ik}$ (primitive forces) constructing the cone, $$f_i = \Sigma_{k=1}^s a_{ik} \hat{f}_{ik}, a_{ik} \leq 0 \quad (2)$$

where $a_{ik}$ are nonnegative constants. The associated wrenches can be expressed by the primitive forces as $$w_i = \sum_{k=1}^s a_{ik} \hat{w}_{ik}$$
$$= \sum_{k=1}^s a_{ik} \begin{pmatrix} \hat{f}_{ik} \\ p_i \times \hat{f}_{ik} \end{pmatrix} \quad (3)$$

where $w_{ik}$ are the primitive wrenches associated with the primitive forces. An n-finger grasp can be represented by the position vectors of all the contact points $P=(p_1, \ldots, p_n)$. Equivalently, the grasp can represented using the matching wrenches that are applied at the contact points that are in turn represented in the part coordinate frame $W=(w_1, \ldots, w_n)$. If the friction is considered by cones, the wrench set can be expressed by the primitive wrenches $W=(w_{11}, w_{12}, \ldots w_{1s}, \ldots, w_{n1}, w_{n2}, \ldots, w_{ns})$. However, as it is desired that the end effector will grasp a set of sheet metals, the grasp model should be modified accordingly. According to the present invention, the clamping of a sheet metal is performed by means of 2-point contact sheet gripper 101, such as the one shown in FIG. 1. Gripper 101 is attached to the end effector (not shown in FIG. 1) by means of arm 103, and it comprises two gripping elements 102.

Therefore, for n pairs of gripping elements 102 that are positioned on the surface of the sheet metal, there are in fact 2n contact points. Each gripping element exerts two opposing forces at the respective contact point. Thus, in practice, it is necessary to calculate 2n gripping contact points. In this manner a coupling constraint is added between each two contact points, a constraint which is the model of the clamping device (gripper) of the present invention.

Figure 2:
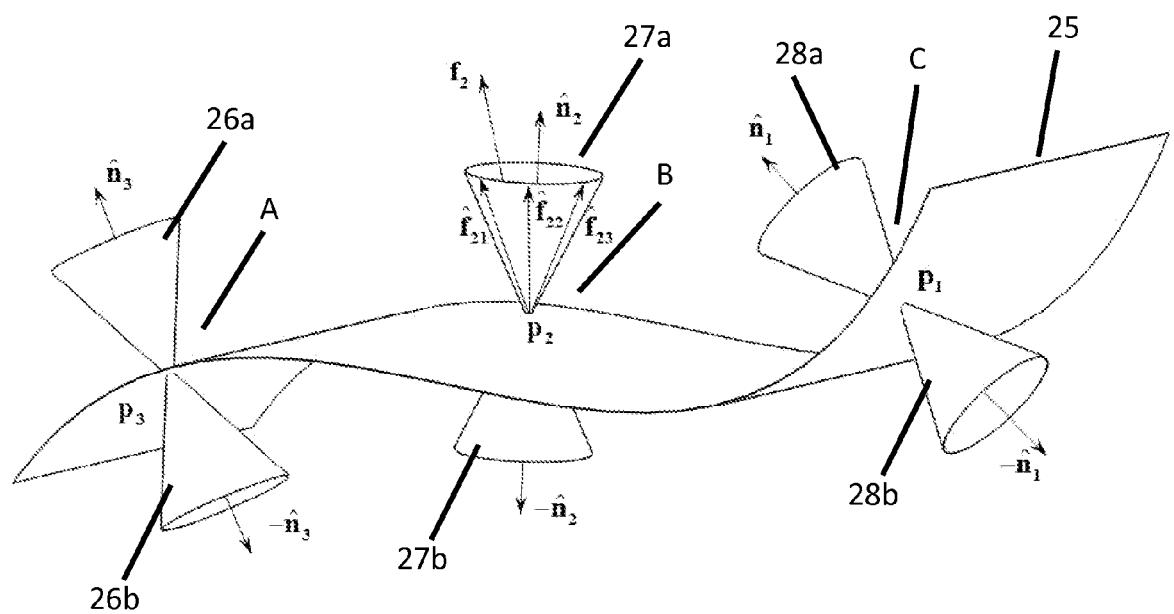
FIG. 2 shows an exemplary of 3 gripping points that are distributed over a sheet metal part.

The CAD of the sheet metal 25 is a surface feature with no thickness. Therefore, each point normal is duplicated in the opposing direction. FIG. 2 illustrates an example of a surface of a given sheet metal, which is grasped by 3 contact points ("gripping points") A, B, and C, where each contact point has two normal directions. The friction cones 26-28 can be seen duplicated as well to the opposing direction. Expressed mathematically, $$w_i = \Sigma_{k=1}^s a_{ik} w_{ik}, \forall i=1, \ldots, n \quad (3)$$

where $w_{ik}$ is a primitive wrench constructing the friction cone of $w_i$. The compatible opposing primitive wrench is $$w'_{ik} = -w_{ik}. \quad (4)$$

Thus, the wrench set W constructing the convex hull of the grasp will be $$W=(w_{11}-w_{11} \ldots w_{1s}-w_{1s}, w_{21}-w_{21} \ldots w_{ns}-w_{ns})_{1 \times 2ns}. \quad (5)$$

As previously noted, a grasp is defined to be force-closure when it is possible to apply wrenches at the contacts such that any external force or torque that acts on the part can be counter-balanced. A system of wrenches can achieve a force-closure condition when any external load can be balanced by a non-negative combination of wrenches.

Definition: A Convex Hull (CH) of a system S of vectors $s_1, \ldots, s_n$ is the set of all non-negative convex combinations of the subsets of points from S. In other words, the CH is the minimal convex set containing S and is defined as $$CH(W) = \{\Sigma_{i=1}^n a_i w_i : w_i \in W, \Sigma_{i=1}^n a_i = 1, a_i \leq 0\} \quad (6)$$

where $a_i$ is the linear combination coefficient bounded to be positive in order to ensure positive grip (non-sticky fingers).

The convex hull of the system of contact wrenches is denoted as the Grasp Wrench Set (GWS).

Theorem 1: A necessary and sufficient condition for a system of n·s wrenches $W=(w_{11}, w_{12}, \ldots w_{1s}, \ldots, w_{n1}, w_{n2}, \ldots, w_{ns})$ to be force-closure is that the origin of $\mathbb{R}^k$ lies in the interior of the convex hull of the contact wrenches. Meaning, $$0 \in \text{interior}(CH(W)) \quad (7)$$

Assuming that a given grasp is well spread along the sheet metal, meaning the n contact points are not concentrated in a same point (n>2), before duplicating the normal directions to their opposite direction respectively, they at least span a cone which lies at one half space. After duplicating the normals as shown in FIG. 2 ($n_i$ to $-n_i$), the normals and their friction cones span the entire space $\mathbb{R}^3$, and thus insuring that the grasp is force closure. Therefore, there is no need for a orce closure analysis using the convex-hull model. Given this observation by the inventors, the runtime of the algorithm which is based on the method of the invention is drastically reduced. This fact also saves the need for modeling and discretizing the friction cones, which typically consumes large computation resources. However, still some kind of a quality measure is necessary in order to filter out undesired grasps within each sheet metal, and thereby to select the best ones.

As it is known that a grasp is force closure, and it can resist external loads, it is desirable to quantify how much external load it can resist, or in other terms, how much resources are required to apply in order to resist an external load. The quality measure, as defined by the present invention, measures how much a grasp can resist an external wrench without the gripping elements loosing contact or begin to slip. A higher quality measure reduces object deformations and actuator resources. The quality measure, as defined herein, is used as a grasp criterion for the process which is discussed later on, and this criterion provides a comparison tool between various grasps. There are several quality measures, most of them are based on a task wrench set (TWS). The TWS is a wrench set of all external wrenches that need to be applied during execution of a prescribed task. The most common quality measure is the one termed largest ball criterion.

However, as mentioned above, a grasp of a sheet metal is always force closure, and its ability to resist external load can be measured by the spread of the gripping elements across the part surface. Therefore, a new quality measure which is denoted Projected Area Quality Measure (PAQM) is defined, and this quality measure will be discussed later on in this application.

The method of the invention involves generation of a set of all possible n-finger grasps for each of the given parts (step 204 of FIG. 13). Furthermore, a parametric representation of a grasp, which is invariant of any coordinate frame, is defined (step 207 of FIG. 13). Those grasps that are force closure are represented as feature vectors in the Force Closure Grasp Set (FCGS). This following discussion describes the proposed structure of the grasp feature vector, and the procedure for constructing the FCGS.

An n-finger grasp of a part B can be defined by a set of n contact points on the part B surface, $$P=\{p_i: p_i \in \mathbb{R}^3 \text{ for } i=1, \ldots, n\} \qquad (8)$$

and the normals to the objects' surface at each point respectively:

$$N=\{\hat{n}_i: \hat{n}_i \in \mathbb{R}^3 \text{ for } i=1, \ldots, n\}. \qquad (9)$$

The procedure defines a transformation map T, which maps each grasp j into a d-dimensional feature vector, injectively representing the grasp, $$T:\{P_j, N_j\} \to e_j \in \mathbb{R}^d \qquad (10)$$

where $e_j$ is a d-sized feature vector $e_j = (u_1 \ldots u_d)^T$. This transformation enables the procedure to map all the possible grasps as feature vectors in the FCGS, and to intersect them later on.

Figure 3A:
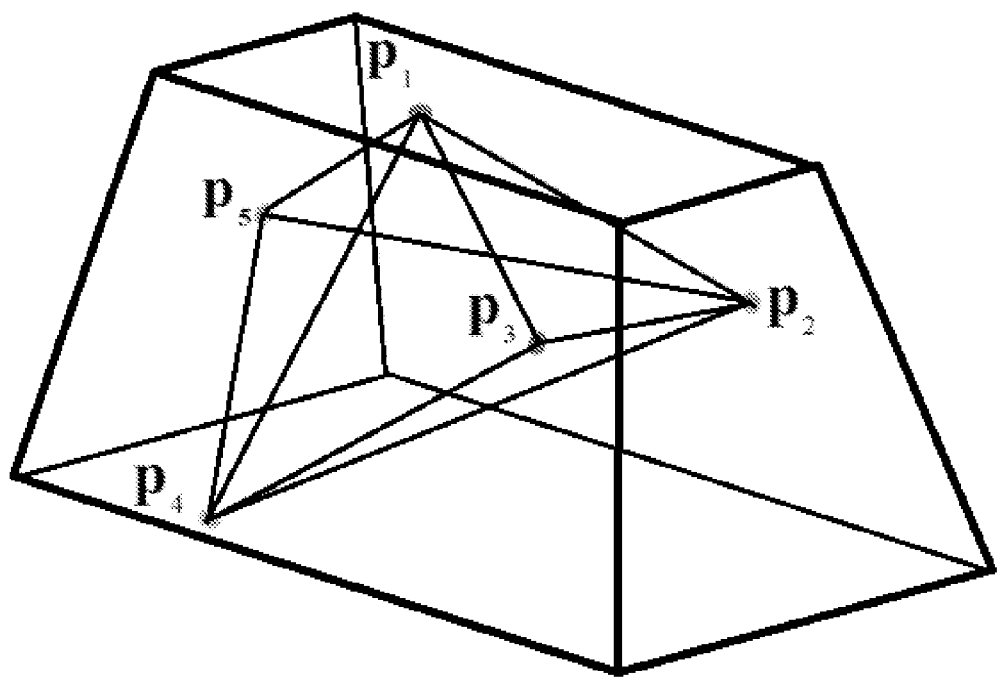
FIG. 3a shows a polytope which is formed from plurality of contact points.

Next, the method involves a step of triangulation. A triangulation of a set P is a partition of it into simplices, where the vertices of each are points of P such that the union of them equals P. Given a set of contact points $p_1, \ldots p_n$, a triangulation of the set can be made in order to form a polytope in which the contact points are its vertices (see FIG. 3a). The triangulation of the point set in $\mathbb{R}^3$ can be done by any known triangulation techniques, such as the Quickhull algorithm, the space sweep technique, etc. The triangulation step outputs a triangles table K (shown in FIG. 3b), that contains respectively triplets of vertices respectively for each of the triangles that form the polytope of FIG. 3a.

The novel feature vector of the invention is in fact divided into two parts, a first part which contains the constraints that define the polytope shape, and a second part which contains the constraints that define the contact point normals relative to the polytope geometry. It has been determined by the inventors (hereinafter, "proposition 1") that for an n-vertex polytope, there are 3n−6 degrees of freedom which determine the polytope's shape.

Proof. For an n-vertex polytope, there are e=3n−6 edges and f=2n−4 facets. Each of the n vertices can be varied with three degrees of freedom (DOF), with a total of 3n degrees of freedom. However, from the total of 3n DOF, three degrees of freedom correspond to translation, and three degrees of freedom correspond to a rotation of the polytope; Therefore, there are 3n−6 degrees of freedom for the polytope's shape.

There are many possible representations for the polytope, some of them depend on the order in which the procedure parameterizes its triangles (step 207 of FIG. 13). Therefore, preferably a transformation map T is provided as an algorithm which uniformly parameterizes the grasps polytope. The feature vector is built according to algorithm 1, which is based on parameterization of the triangles by a specific order, ensuring that the feature vector be injective to the polygon.

---

Algorithm 1 - Feature Vector Generation - step 207 of FIG. 13

INPUT: Grasp point set $P_j$, normals at each point $N_j$.
Output: Feature vector $e_j$.
1. Generate triangles table K of $p_1, \ldots, p_n$ with the triangulation algorithm.
2. for i = 1 → 2n − 4 do
3.     A(i) = Area(K(i)) //computes area of triangle i.
4. end for
5. $t_1 = \arg\max_i(A_i)$ //index of the largest area triangle denoted as the 'base' of the polytope.

6. Generate adjacency table Y.
7. $[v_1, v_2]$ = vertices indices of the largest edge of triangle $t_1$.
8. $v_3$ = index of the third vertex of triangle $t_1$.
9. $d_1 = \|p_{K(t_1, v_1)} - p_{K(t_1, v_2)}\|$ //length of longest edge of $t_1$.
10. for i = 1 → (n − 2) do
11. $$y_i^1 = \cos^{-1} \frac{(p_{K(t_i, v_2)} - p_{K(t_i, v_1)}) \cdot (p_{K(t_i, v_3)} - p_{K(t_i, v_1)})}{\|p_{K(t_i, v_2)} - p_{K(t_i, v_1)}\| \|p_{K(t_i, v_3)} - p_{K(t_i, v_1)}\|}$$
12. $$y_i^2 = \cos^{-1} \frac{(p_{K(t_i, v_1)} - p_{K(t_i, v_2)}) \cdot (p_{K(t_i, v_3)} - p_{K(t_i, v_2)})}{\|p_{K(t_i, v_1)} - p_{K(t_i, v_2)}\| \|p_{K(t_i, v_3)} - p_{K(t_i, v_2)}\|}$$
13. $$n_{t_i}^f = \frac{(p_{K(t_i, v_2)} - p_{K(t_i, v_1)}) \times (p_{K(t_i, v_3)} - p_{K(t_i, v_1)})}{\|p_{K(t_i, v_2)} - p_{K(t_i, v_1)}\| \|p_{K(t_i, v_3)} - p_{K(t_i, v_1)}\|} // n_{t_i}^f \text{ is}$$

the normal to the surface of triangle $t_i$.

14. if i ≠ 1 then
15.     $\theta_i = \cos^{-1}(n_{t_i}^f \cdot n_{t_{i-1}}^f)$ // $n_{t_i}^f$ is the normal to the surface of triangle $t_i$.
16.     $t_{i+1}$ = triangle adjacent to $K(t_i)$ but not adjacent to $K(t_{i-1})$ according to Y.
17.     if $t_{i+1}$ adjacent to $t_i$ with edge $v_1, v_3$ then
18.       $v_2 = v_3$
19.     else
20.       $v_1 = v_3$
21.     end if
22.     $v_3$ = index of the third vertex of triangle $t_{i+1}$.
23.     else
24.       $v_2 = v_3$
25.       $t_2$ = triangle adjacent to $t_1$ on edge $v_1, v_2$.
26.       $v_3$ = index of the third vertex of triangle $t_2$.
27.     end if
28. end for
29. for i = 1 → n do
30.     $\varphi_i^1 = \cos^{-1}(\hat{n}_i \cdot n_1^f)$ //angle of normal $\hat{n}_i$ with triangle $t_1$.
31.     $\varphi_i^2 = \cos^{-1}(\hat{n}_i \cdot n_2^f)$ //angle of normal $\hat{n}_i$ with triangle $t_2$.
32. end for
33. $e_j = (y_1^1 y_1^2 d_1 y_2^1 y_2^2 \theta_2 \ldots y_l^1 y_l^2 \theta_l \ldots \varphi_1^1 \varphi_1^2 \ldots \varphi_n^1 \varphi_n^2)^T$

---

Algorithm 1 first parameterizes the triangle with the largest area, and moves on to the one adjacent to it with the edge defined by $\gamma_1$. As mentioned above in proposition 1, three constraints are required to parameterize a triangle with total of 3n−6 constraints for the entire polytope, therefore it is necessary to constrain $$\frac{3n-6}{3} = n - 2$$

triangles of the polytope to fully parameterize it. The parameterization moves on a chain of n−2 adjacent triangles, each with 3 parameters. Moreover, the algorithm describes the normals at the contact points relative to the polytope. Each normal needs 2 constraints in order to describe it, therefore 2n more parameters are required. Thus, the dimensionality of the feature vector is:

$$d=3n-6+2n=5n-6 \quad (11)$$

The procedure for constructing a d=5n−6 dimensional feature vector for an n-finger grasp and its operation is as follows. The begins with the construction (step 1 of algorithm 1) of a triangles table (like the one in FIG. 3*b*) and defines triangle $t_1$ as the one with the largest area (steps 2-5), $t_1$ refers to the base of the polytope. In step 6, an adjacency table Y (such as the one of FIG. 3*c*) is formed, denoting for each triangle its adjacent triangles according to common vertices in the triangles table K. The procedure generates a sorted list (table) of adjacent triangles to each triangle. Such a table is used to identify the next adjacent triangle to parameterize. Afterwards, the indices of triangle $t_1$ are stored, where $v_1$ and $v_2$ form the longest edge of the base triangle, and $v_3$ is the third vertex of the triangle. The first parameter to be computed is the length $d_1$ of $\overline{v_1 v_2}$ (step 9) where $p_{K(t_i,v_j)}$ is the location vector of vertex $v_j$ of triangle $t_i$ which is stored in table K. The for-loop (steps 10 to 28) computes the shape parameters of the polytope, where for the first triangle (the base), 2 angles $\gamma_1^1$, $\gamma_1^2$ and the edge between them $d_1$ are calculated. In the other n−1 triangles, for triangle $t_i$ the two angles $\gamma_i^1$, $\gamma_i^2$ of the triangle are calculated, those angles bound the edge which is common to triangles $t_i$ and $t_{i-1}$. Moreover, the angle $\vartheta_i$ between the two triangles $t_i$ and $t_{i-1}$ are also calculate (step 15). Within each loop iteration, the next triangle $t_{i+1}$ which is adjacent to $t_i$ but not adjacent to $t_{i-1}$ (according to an adjacency table Y) is selected. If two of such triangles exist, the one which is adjacent to $t_i$ with the longest edge is preferably selected. This condition is maintained in order to assure a single unique parameterization for all polytopes. After the selection of $t_{i+1}$, the $v_1$, $v_2$, $v_3$ are update in order to store the vertices of triangle $t_{i+1}$. In the last for-loop (steps 29-32), each normal is parameterized to two angles $\phi_i^1$, $\phi_i^2$, that are the angles of the normal with triangles $t_1$ and $t_2$ respectively. These two triangles were chosen arbitrarily to ensure a standard representation of the feature vectors.

EXAMPLE 1

Figure 4:
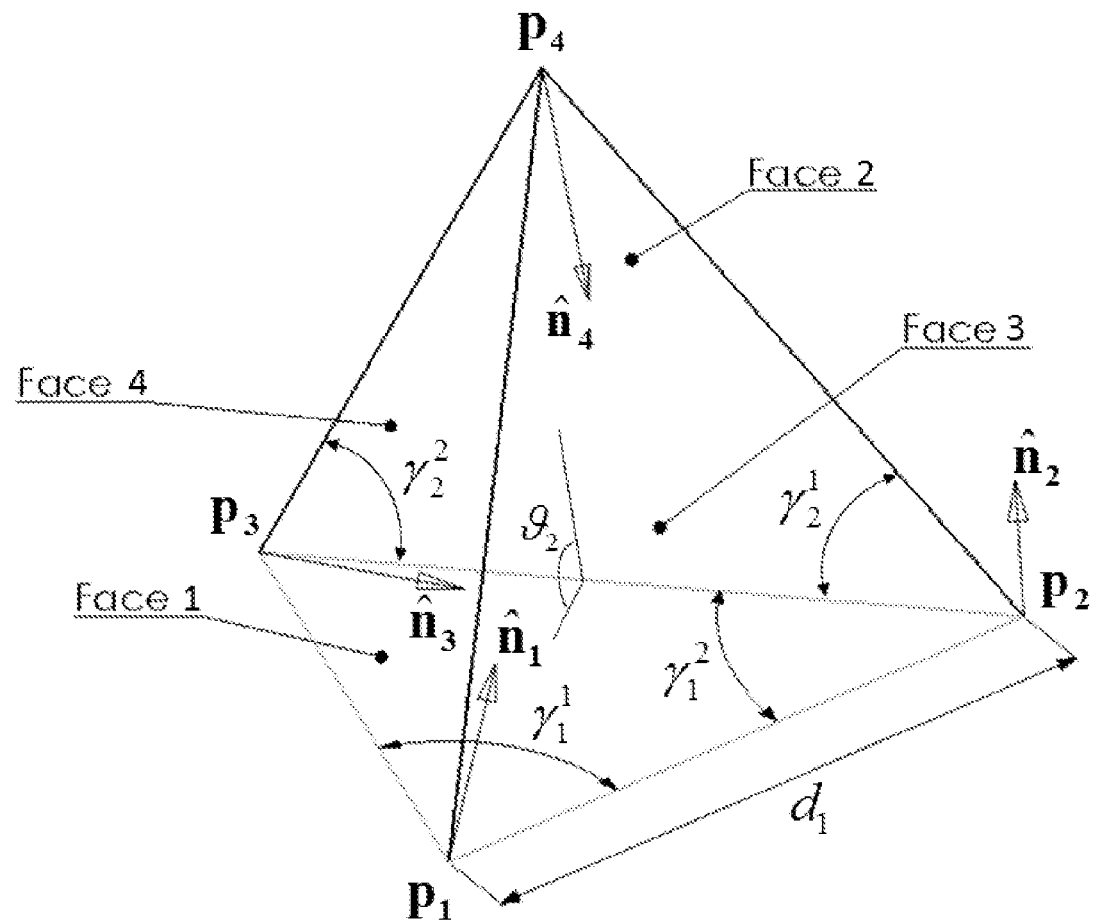
FIG. 4 shows an exemplary 4-finger grasp which is parameterized using a 14 dimensional feature vector.

A 4-finger grasp can be described by a tetrahedron (4 facet polytope—see FIG. 4, the 4 faces are marked as Face 1-Face 4). FIG. 4 in fact represents a 4-finger grasp which is parameterized using a 14 dimensional feature vector. According to Proposition 1, six constraints are necessary to describe the tetrahedrons shape and the 8 parameters to describe the normal directions relative to the tetrahedron, resulting in a 14-dimensional feature vector. This example now considers the algorithm to calculate face 4 as the base triangle with the largest area. The parameters representing the shape of the tetrahedron, according to this algorithm, are given as follows. The length of the longest edge $\overline{p_1 p_2}$ of the base triangle $t_1 = \Delta p_1 p_2 p_3$ (the largest area triangle)

$$d_1 = \|p_1 - p_2\| \quad (12)$$

and the two angles adjacent to the edge $$\gamma_1^1 = \cos^{-1}\left(\frac{(p_3 - p_1) - (p_2 - p_1)}{\|p_3 - p_1\| \|p_3 - p_1\|}\right) \quad (13)$$

$$\gamma_1^2 = \cos^{-1}\left(\frac{(p_1 - p_2) - (p_3 - p_2)}{\|p_1 - p_2\| \|p_3 - p_2\|}\right) \quad (14)$$

The next two angles are the angles of the adjacent triangle $t_2 = \Delta p_2 p_3 p_4$, which is adjacent to the shared edge $\overline{p_2 p_3}$ $$\gamma_2^1 = \cos^{-1}\left(\frac{(p_4 - p_2) - (p_3 - p_2)}{\|p_4 - p_2\| \|p_3 - p_2\|}\right) \quad (15)$$

$$\gamma_2^2 = \cos^{-1}\left(\frac{(p_4 - p_3) - (p_2 - p_3)}{\|p_4 - p_3\| \|p_2 - p_3\|}\right) \quad (16)$$

and the angle between the two triangles $$\vartheta_2 = \cos^{-1}(n_4^f \cdot n_1^f). \quad (17)$$

As there are n=4 contact points, it is necessary to parameterize only n−2=2 triangles, i.e., $t_1$ and $t_2$.

The representation of the normals direction is given by $$\phi_i^1 = \cos^{-1}(\hat{n}_i \cdot n_4^f), i=1,2,3,4, \quad (18)$$

$$\phi_i^2 = \cos^{-1}(\hat{n}_i \cdot n_1^f), i=1,2,3,4 \quad (19)$$

Therefore, the resulting feature vector is $$e = (\gamma_1^1 \gamma_1^2 d_1 \gamma_2^1 \gamma_2^2 \vartheta_2 \phi_1^1 \phi_1^2 \phi_2^1 \phi_2^2 \phi_3^1 \phi_3^2 \phi_4^1 \phi_4^2)^T. \quad (20)$$

EXAMPLE 2

Figure 5A:
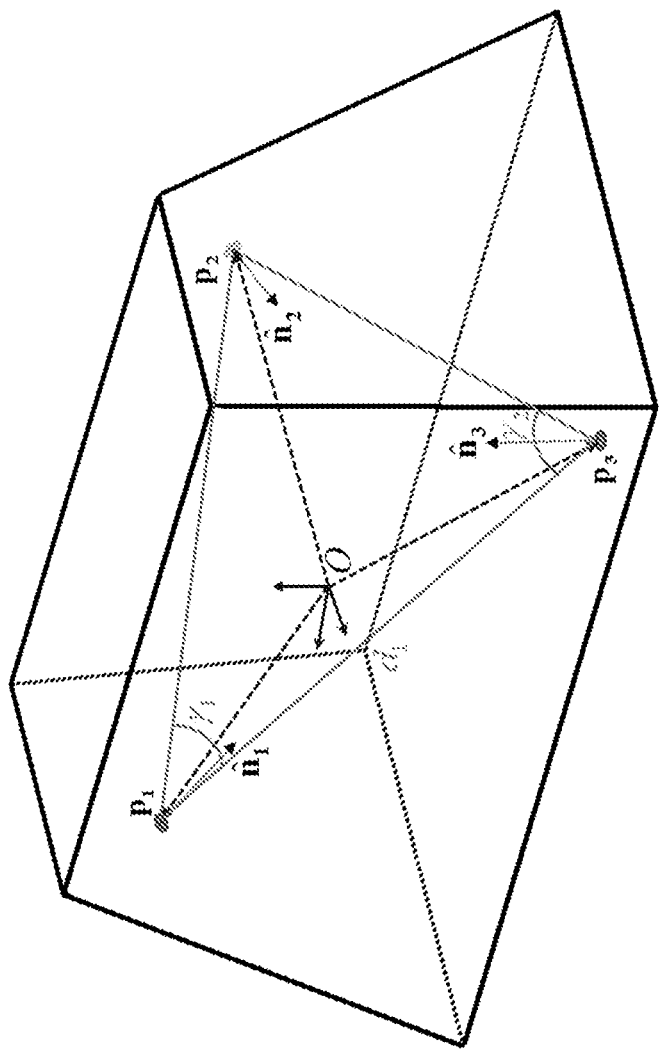
FIG. 5a illustrates a 3-finger grasp of an object B, which is described by a single triangle having 3 vertices.
Figure 5B:
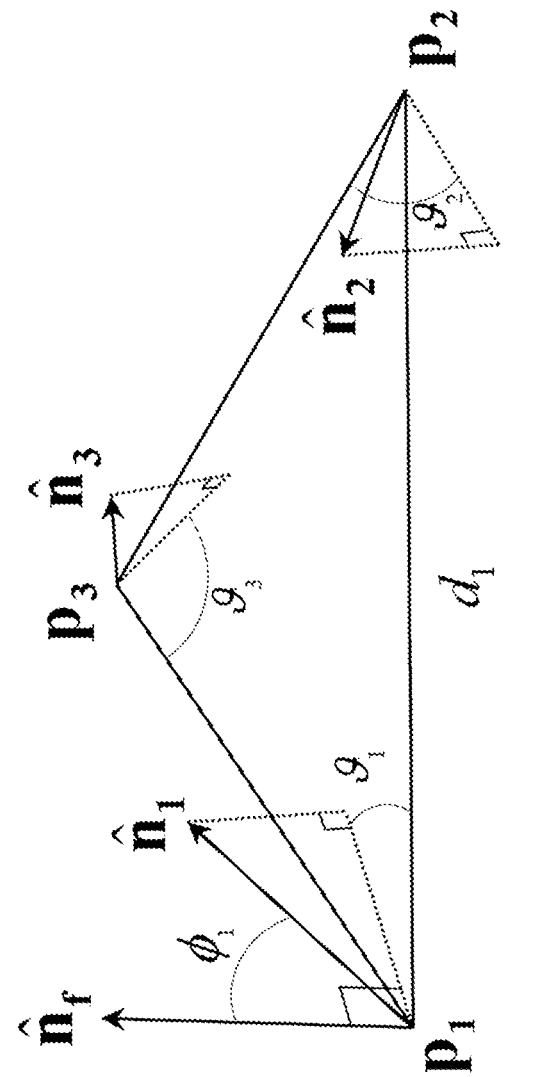
FIG. 5b shows how normals are described at a contact point by two angles with reference to the triangle.

A 3-finger grasp of object B is described by a single triangle having 3 vertices. An example of such configuration of a grasp is illustrated in FIG. 5*a*. The position of the 3 fingers relative to each other can be injectively represented as a triangle by two angles $\gamma_1$, $\gamma_2$ and the edge length between them as $d_1$, given by equations (12)-(14). However, for three contact points, the polytope degenerates into a triangle and therefore this case is not fully covered by algorithm 1. Therefore, and as shown in FIG. 5*b*, the normals are described at the contact points by two angles. Angle $\phi_i$ is the angle between the normal $\hat{n}_i$ and the normal to the triangle surface $\hat{n}_f$ given by $$\phi_i = \cos^{-1}(\hat{n} \cdot \hat{n}_f), i=1,2,3 \quad (14)$$

and angle $\vartheta_i$ is the angle of the normal's projection on the triangle surface with the adjacent triangles edge, given by the following Equation 15:

$$\vartheta_i = \begin{cases} \frac{\pi}{2} - \text{sgn}(((\hat{n}_3 \times \hat{n}_f) \times \hat{a}_{3,1}) - \hat{n}_f) \cos^{-1}((\hat{n}_3 \times \hat{n}_f) - \hat{a}_{3,1}), & i=3 \\ \frac{\{\pi}{2} - \text{sgn}(((\hat{n}_i \times \hat{n}_f) \times \hat{a}_{i,i+1}) - \hat{n}_f) \cos^{-1}((\hat{n}_i \times \hat{n}_f) - \hat{a}_{i,i+1}), & \\ & i=1,2 \end{cases} \quad (15)$$

where $$a_{i,j} = \frac{p_j - p_i}{\|p_j - p_i\|}.$$

The feature vector for the 3-finger grasp is therefore a 9-dimensional vector:

$$e = (\gamma_1 \gamma_2 d_1 \phi_1 \phi_2 \phi_3 \vartheta_1 \vartheta_2 \vartheta_3)^T \quad (23)$$

As in a preferable embodiment the clamping apparatus of the invention is designed to clamp only near the boundaries of the sheet metal part, there is no need for the inner triangles mesh, which is in fact excessive and causes tremendous calculation runtime. Therefore, the use of an algorithm for omitting the inner mesh triangles is preferred.

Figure 6:
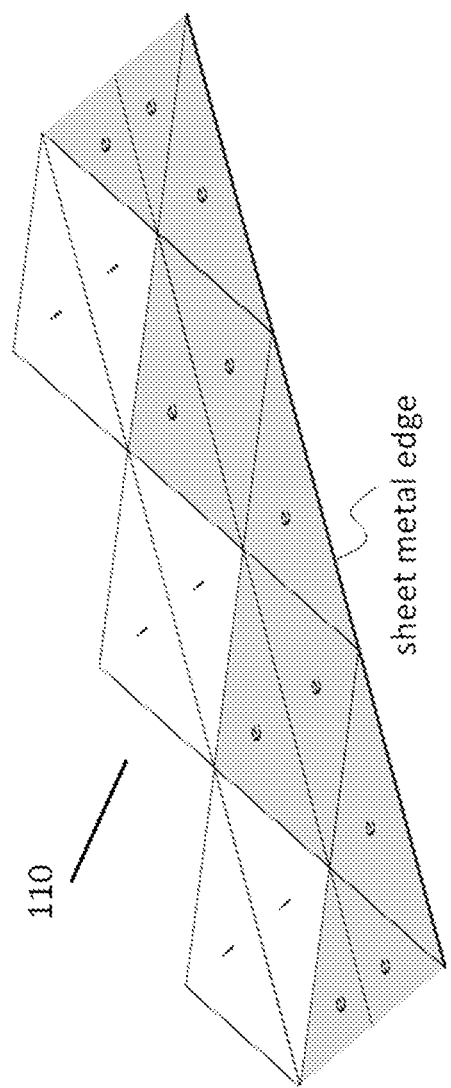
FIG. 6 illustrates a procedure for a triangular mesh reduction.

The meshing, step 201 of FIG. 13, is now explained in more details. Meshing using COMSOL Multiphysics outputs two matrices, one $M \in \mathbb{R}^{\lambda \times 3}$ for λ points constructing the triangles, and one $J \in \mathbb{R}^{k \times 3}$, where each row denotes 3 indices of points from M composing a triangle, with a total of k triangles. m is defined as the number of layers of inner triangles from the boundary that are considered as edge triangles. FIG. 6 shows an exemplary case 110 for marking edge triangles (e) and inner triangles (i) when m=3.

Figure 7:
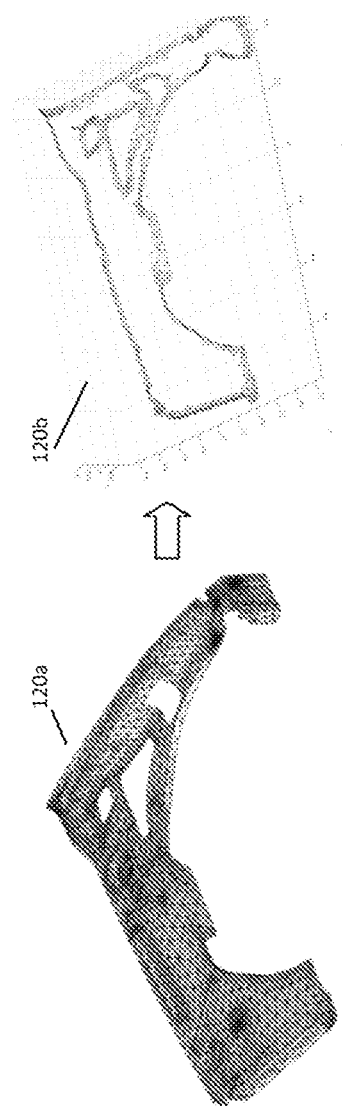

The mesh reduction of step 202 of FIG. 13 is now explained in more details. This mesh reduction algorithm is based on the marking of the neighbors of each triangle (FIG. 6), while those having 2 neighbors are boundary triangles (marked as 'e') and those having 3 neighbors are inner triangles (marked as 'i'). Next, the procedure continues by marking as boundary triangles those that are located a distance m from the boundary triangles. FIG. 7a shows an exemplary part 120a with a full triangles mesh, while FIG. 7b shows an outcome of a mesh reduction algorithm as applied to the edges part 120a, where m=3. Part 120a with the reduced mesh is indicated in FIG. 7b as 120b.

The following algorithm 2 may be used to obtain a reduced mesh, based on the procedure above:

ALGORITHM 2

Reduction of the mesh by removal of inner triangles
INPUT: Matrices M and J and number of layers m.
OUTPUT: New reduced matrix J with inner triangles removed.

1. //Identify neighbors for each triangle
2. Sort J by columns and then by rows.
3. for i = 1 → k do
4.    b = i + 1
5.    while $J_{b,1} < j_{i,3}$ and b < k do
6.      b = b + 1
7.    end while
8.    for j = i + 1 → b do
9.      If Intersect(J(i), J(j)) then
10.        Add i as neighbor to j in neighbors table $N_J$ and vice versa.
11.      end if
12.    end for
13. //Classify triangles with 2 neighbors as edge and with 3 as inner triangles.
14.    for i = 1 size($N_J$) do
15.      if triangle i has 2 neighbors according to $N_J$ then
16.        Mark i as edge ('e')
17.      else
18.        Mark i as inner ('i')
19.      end if
20.    end for
21. //Consider triangles with distance m from edge as boundary triangles.
22.    for l = 1 → m do
23.      for i = 1 → size($N_J$) do
24.        if triangle i is an inner triangle ('i') then
25.          if triangle i has at least 1 edge neighbor according to $N_J$ then
26.            Mark i as edge ('e')
27.          end if
28.        end if
29.      end for
30.    end for
31. remove triangles marked as inner ('i') from J.
32. return J.

The Projected Area Quality Measure (PAQM) is a grasp quality measure which is particularly defined by the inventors for sheet metal, and is used to filter out inappropriate grasps according to a heuristic condition, as will be described in more details below. The defining of the PAQM is based on a projection of the clamping points on a plane calculated according to least square fitting. The area of the polygon formed by the points on the plane is the forms the basis for the quality measure. The larger the area is relative to the maximum area possible, the better the grasp is.

Given n clamp points $\mathcal{F}_j=(p_1, \ldots, p_i, \ldots, p_n)$, where $p_i=(x_i, y_i, z_i)$, a plane z=ax+by+c can be found, which best fits the points. The plane is calculated by least square fitting, where the sum of squared errors of the vertical distance between $z_i$ and the plane is minimized. The sum of square errors is given by:

$$S(a,b,c)=\Sigma_{i=1}^{n}[(ax_i+by_i+c)-z_i]^2 \quad (24)$$

In order to minimize S, its gradient is equalized to 0. This leads to a system of $$\begin{pmatrix} a \\ b \\ c \end{pmatrix} = \begin{bmatrix} \sum_{i=1}^{n} x_i^2 & \sum_{i=1}^{n} x_i y_i & \sum_{i=1}^{n} x_i \\ \sum_{i=1}^{n} x_i y_i & \sum_{i=1}^{n} y_i^2 & \sum_{i=1}^{n} y_i \\ \sum_{i=1}^{n} x_i & \sum_{i=1}^{n} y_i & \sum_{i=1}^{n} 1 \end{bmatrix}^{-1} \begin{pmatrix} \sum_{i=1}^{n} x_i z_i \\ \sum_{i=1}^{n} y_i z_i \\ \sum_{i=1}^{n} z_i \end{pmatrix} \quad (25)$$

where its solution provides the coefficients for the desired plane. The projection point $p_{i'}=(x_{i'}, y_{i'}, z_{i'})$ of point $p_i$ on the plane is given by:

$$\begin{pmatrix} x_{i'} \\ y_{i'} \\ z_{i'} \end{pmatrix} = \begin{pmatrix} x_i \\ y_i \\ z_i \end{pmatrix} - \frac{ax_i + by_i - z_i + c}{a^2 + b^2 + 1} \begin{pmatrix} a \\ b \\ -1 \end{pmatrix}. \quad (26)$$

Next, a set of points $\mathcal{F}'_j=(p_{1'}, \ldots, p_{n'})$ on the plane are acquired. If the points are rotated (using rotation matrices) on the plane to be parallel to the xy-plane, the points will be planar $p_{i''}=(x_{i''}, y_{i''}, 0)$. It is now possible to generate a polygon affiliated to grasp j of object i formed by the points and to calculate its area:

$$A_j^i = \frac{1}{2}\left(\left|\begin{matrix} x_1 & x_2 \\ y_1 & y_2 \end{matrix}\right| + \left|\begin{matrix} x_2 & x_3 \\ y_2 & y_3 \end{matrix}\right| + \ldots + \left|\begin{matrix} x_n & x_1 \\ y_n & y_1 \end{matrix}\right|\right) \quad (27)$$

For each sheet metal, the procedure goes through all possible combinations of n clamping points, and finds the largest area of the projected polygon they construct among all sheet metals, denoted as $A_{max}$. The area calculated is a measure of how much the grasp is distributed across the sheet metal. Therefore, this procedure defines a novel quality measure for grasp j of sheet metal parts i, $$Q_j = \frac{A_j^i}{A_{max}}. \quad (28)$$

Figure 8:
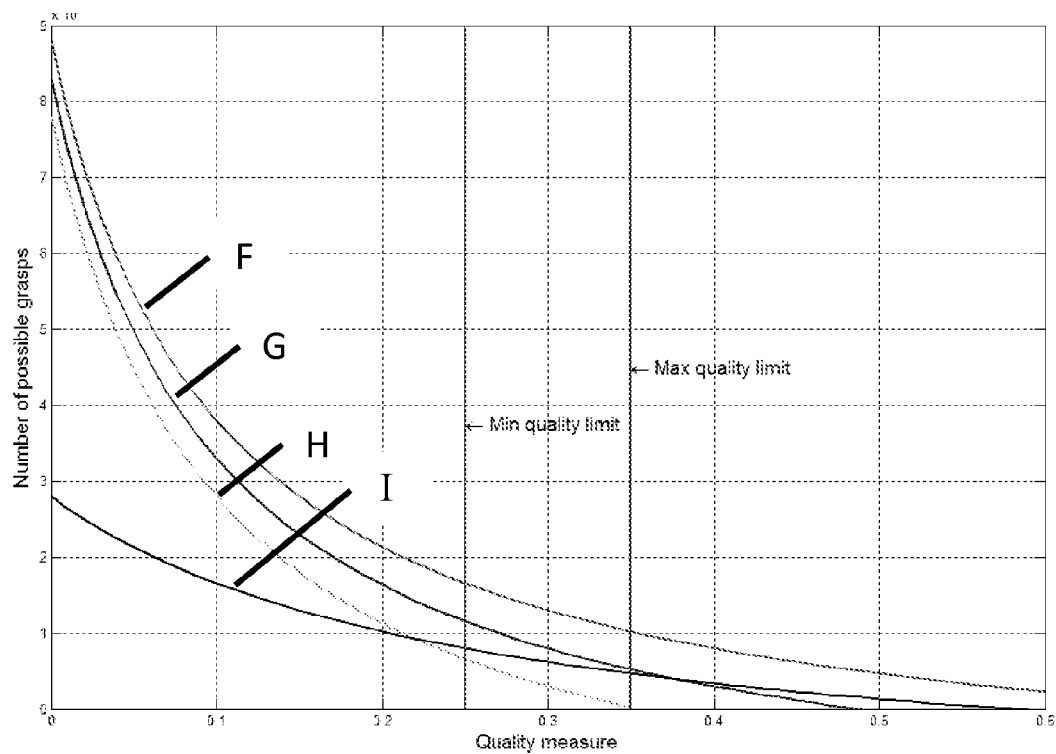
FIG. 8 shows an example of a distribution graph which shows respectively the number of grasps against the level of quality measure.

Prior to the generation of the FCGS, a distribution graph of the quality measures is built for each sheet metal part, as shown, for example, in FIG. 8. The distribution graph describes the number of grasps against the level of quality measure (the higher the quality measure, the better the grasp is). Each curve F, G, H, and I respectively in the distribution graph relates to a different part. This is done by sampling polygons areas from the sheet metal surface. q sets of measures $Q^i$ are acquired. The maximum limit of the quality measure to search is:

$$Q_{max} = \min_i\left(\max_j(Q_j^i)\right) \quad (29)$$

where j is the size of each set. The minimum limit of the measure $Q_{min}$ is defined by a maximum number $\beta$ of points in a set. Therefore, $Q_{min}$ is chosen to be:

$$Q_{min} = \max_i (Q_{min}^i) \quad (30)$$

such that each $Q_{min}^i$ maintains the condition:

$$\int_{Q_{min}^i}^{Q_{max}} f_i(Q^i) dQ^i \leq \beta \cdot (Q_{max} - Q_{min}^i), \forall\, i = 1, \ldots, q \quad (31)$$

where $f_i(Q^i)$ is a polynomial fit of the distribution points acquired previously. The choice of the number of points $\beta$ within the set has direct effect on the runtime, and therefore is chosen accordingly. The more points are chosen, the effect is the runtime increases exponentially with the number of gripping points.

As noted, according to a preferred embodiment of the invention, the FCGS (Force Closure Grasp Set) is generated by exhaustive search for substantially all, or most of the possible grasps of each part B. This is done by using algorithm 2 which has been provided above, and by filtering out all grasps that are not bounded between $Q_{max}$ and $Q_{min}^i$. The following algorithm receives a 3D mesh of the original sheet metal part, consisting of a set of points $\mathcal{P} \in \mathbb{R}^3$ and a set of normals at each point $\tilde{N} \in \mathbb{R}^3$. The algorithm 3 goes over all possible n-finger grasps—steps 203 and 204 of FIG. 13—$\mathcal{F}_j = (p_1, \ldots, p_n)$, and selects only the ones which serves the desired quality limits. The ones selected are transformed into a feature vector $e_j$ and added to the grasp set $\varepsilon \subset \mathbb{R}^d$, which is the output of the algorithm. Algorithm 3, which is preferably used by the present invention for generating the FCGS.

ALGORITHM 3

FCGS generation
INPUT: Mesh of object B to be grasped, $\{\mathcal{P}, \tilde{N}\}$.
OUTPUT: FCGS $E = (e_1, \ldots, e_v)$ of object B.

1. Generate grasp j defined by $\mathcal{P}_j = (p_1, \ldots, p_n) \in \mathcal{P}$. //by sequential scan over the mesh points.
2. if $Q_{min}^i \leq Q(P_j) \leq Q_{max}$ then [these are steps 205-206 of Fig. 13]
3. Map grasp j to feature vector $e_j = (u_1 \ldots u_d)^T$ //according to Algorithm 1.
4. Label $e_j$ as force-closure and add to set $\varepsilon$.
5. Store a pointer from $e_j$ to $\mathcal{P}_j$
6. end if
7. if $\varepsilon = (e_1, \ldots, e_v)$ is not fully labeled then
8. go to 1
9. else
10. return grasp set $\varepsilon$
11. end if For the q query objects $B_1, \ldots, B_q$, Algorithm 3 is applied and it generates the FCGS $\varepsilon_1, \ldots, \varepsilon_q$ for all the parts.

The following description explains steps 208 and 209 of FIG. 13 in more details. The next step provides a procedure for performing a nearest-neighbor search and classification, in order to find common points between the sets of grasps that have been found separately for each part, meaning, to find common grasps that are suitable for all the parts. More specifically, these common points are used in the common end effector of the present invention.

Given q sets of vectors of the FCGS $(\varepsilon_1, \ldots, \varepsilon_q) \subset \mathbb{R}^{d \times q}$, one for each part, a similarity algorithm is used by the present invention in order to find common vectors of the sets, in which the distance between them is smaller than a predefined tolerance. This is done using Nearest-Neighbor search and classification as described in more details below.

In one embodiment of the invention, a database structure known as a kd-tree is used. Each FCGS set is represented as a d-dimensional binary tree thereby constructing an organized data structure which enables efficient nearest-neighbor search. The kd-tree data representation is based on dimension partitioning. Several algorithms for nearest neighbor search which operates on kd-tree are known. They take advantage of the kd-tree structure for the search of a point in one set, which is the closest to a query point in a different set. It should be noted that preferably, the nearest neighbor search algorithm of the invention uses Euclidean distance criterion. However, due to the structure of the feature vector, the d-dimensional space is not homogenous and the Euclidean distance does not reflect the grasping demands. Therefore, preferably another metric which better meets the requirement is used. The method of the invention is not bounded to the use of the specific closest point to another, so, if a custom distance criteria fails, the second closest point may be used, or else the next one. Therefore, in one embodiment a k-nearest-neighbor search which can determine up to k closest points to a query point, is preferably used by the present invention.

Preferably, a similarity join algorithm is used to pair points in each two d-dimensional sets $\varepsilon_i, \varepsilon_j$. For example, the following Algorithm 4 may be used:

ALGORITHM 4

Function JoinFCGS $(\varepsilon_1, \ldots, \varepsilon_q)$
INPUT: FCGS of each object $\varepsilon_1, \ldots, \varepsilon_q$.
OUTPUT: Registry set $\mathcal{Z}$.

1. for i = 0 → q − 1 do
2. for j = i + 1 → q do
3. $[\mathcal{A}, \mathcal{B}]$ = NearestNeighbor($\varepsilon_i, \varepsilon_j$).
4. for k = 1 → size($\mathcal{A}$) do
5. if IsSimilar($a_k \in \mathcal{A}, b_k \in \mathcal{B}$) = true then.
6. $\mathcal{Z}$ = InsertToZ($a_k, b_k, i, j$)
7. end if
8. end for
9. end for
10. end for
11. $\mathcal{Z}$ = RearrangeReg($\mathcal{Z}$)
12. return Z Algorithm 4 receives the grasp sets $\varepsilon_1, \ldots, \varepsilon_q \in \mathbb{R}^d$, and for each two sets, it performs a nearest neighbor (NN) search (implemented, for example, by MATLAB's knnsearch function) to find for each vector in one set the closest one in the other. The function NearestNeighbor, which is called from within JoinFCGS, receives two FCGS sets $\varepsilon_i, \varepsilon_j$ and outputs two parallel sets $\mathcal{A}, \mathcal{B}$ which are stored in such a manner that each vector $a_k \in \mathcal{A}$ is the closest one to $b_k \in \mathcal{B}$. As the d-dimensional space is not homogenous, each pair of vectors that are found cannot be considered as the same vector with only the Euclidean distance. Therefore, a custom distance metric is added, wherein this metric is varied according to the properties of the grasp, e.g., coefficient of friction, part manufacturing tolerances, etc. Therefore, a custom metric between the two vectors $x \in \varepsilon_i$ and $y \in \varepsilon_j$ is defined:

$$|x_i - y_i| \leq \varepsilon_i, \text{ for } i = 1, \ldots, 3n-6 \quad (32)$$

where, $\varepsilon_1, \ldots, \varepsilon_{3n-6}$ are predefined tolerances. This means that the two feature vectors (only the shape part) are to be inside a hyper-rectangle with edge lengths of $\varepsilon_1, \ldots, \varepsilon_{3n-6}$. Moreover, it is demanded that each two respective normals ($\hat{n}_i^x$ from feature vector x and $\hat{n}_i^y$ from feature vector y) at the contact points (represented in feature vector $e_j$ as $\phi_i^1$, $\phi_i^2$—for example, equation (20)) to be both within a friction cone, satisfying:

$$\cos^{-1}(\hat{n}_i^x \cdot \hat{n}_i^y) \le 2\alpha \cdot \tan^{-1}\mu, 0 < \alpha \le 1 \quad (33)$$

where α is a safety factor. This condition insures that the angle between each two respective normals is smaller then the friction cone angle multiplied by a predefined safety factor. Conditions (32) and (33) are implemented by the following function IsSimilar (Algorithm 5):

ALGORITHM 5

Function IsSimilar(x, y)
INPUT: Feature vectors x and y representing n-finger grasps.
OUTPUT: Are x and y within the predefined tolerances (true/false).

1. for i = 1 → (3n − 6) do
2.    if |x(i) − y(i)| > $\varepsilon_i$ then
3.      return False
4.    end if
5. end for
6. for i = (3n − 5) → d do
7.    Calculate $\hat{n}_i^x((x(i), x(i + n))$
8.    Calculate $\hat{n}_i^y(y(i), y(i +n))$
9.    if $\cos^{-1}(\hat{n}_i^x \cdot \hat{n}_i^y) > 2\alpha \cdot \tan^{-1}\mu$ then
10.      return False
11.    end if
12. end for
13. return True Algorithm 5 receives two feature vectors and returns true or false for satisfying the conditions (32) and (33) or not, respectively. In the first loop, the algorithm checks whether condition (32) is satisfied for the first part of the feature vector (i.e, the shape part). Next, the algorithm restores the normal vectors according to the angles given in each feature vector and then compares them according to condition (33).

When two vectors from two different sets are close enough to be considered the same, they are inserted to a registry set $\mathcal{Z} \in \mathbb{R}^d$ and store a pointer to their original grasp. The set $\mathcal{Z}$ is a d-dimensional database (one for each part) of the vectors taken from $\varepsilon_1, \ldots, \varepsilon_q$. The vectors that are inserted to $\mathcal{Z}$ are the ones that are common to two or more sets of $\varepsilon_1, \ldots, \varepsilon_q$. Let assume that $\mathcal{U}_q$ is a q-dimensional vector space of binary values, i.e., containing q-sized vectors of 0's and 1's. Each common vector $v_i \in \mathbb{R}^d$ added to $\mathcal{Z}$ is coupled to a compatible vector $\tilde{v}_i \in \mathcal{U}_q$. Component r of vector $\tilde{v}_i$ denotes whether the vector is in the set $\varepsilon_r$ if labeled "1", and "0" if not. Therefore, two vectors, $e_i \in \varepsilon_i$ and $e_j \in \varepsilon_j$ that are considered to be the same, are the input to the following procedure InsertToZ (Algorithm 6):

Algorithm 6 - Function Insert To Z($e_i$, $e_j$, i, j)

INPUT: Vector $e_i$ in FCGS i and vector $e_j$ in FCGS j.
OUTPUT: Updates registry set Z to contain a, b.

1. $v_{i,j} = \left( \dfrac{e_i(1) + e_j(1)}{2} \cdots \dfrac{e_i(d) + e_j(d)}{2} \right)^T$ 2. u = NearestNeighbor(Z, $v_{i,j}$)//FindNN of v.
3. if IsSimilar($v_{i,j}$, u) = true then
4.    $\tilde{u}(i) = 1$
5.    $\tilde{u}(j) = 1$
6. else
7.    Add point $v_{i,j}$ to Z.
8.    $\tilde{v}(i) = 1$

Algorithm 6 - Function Insert To Z($e_i$, $e_j$, i, j)

9.    $\tilde{v}(j) = 1$
10. end if

Algorithm 6 takes the mean vector $v_{i,j}$ of the pair and checks whether it already exists in registry set $\mathcal{Z}$ (using IsSimilar). If it finds that vector u is the same as $v_{i,j}$, it sets $\tilde{u}_i$ and $\tilde{u}_j$ to 1, meaning, the point exists in $\varepsilon_i$ and $\varepsilon_j$. If, however, it does not find the point in $\mathcal{Z}$, it adds it and than mark it to the compatible grasp sets.

After the construction of registry set $\mathcal{Z}$, function RearrangeReg at the end of algorithm 4 extracts the original vectors that constructed the vectors in $\mathcal{Z}$ from their affiliated FCGS. They are extracted according to the coupled binary vectors which denote in which FCGS they exist. This function recalculates each vector $v_i$ in $\mathcal{Z}$ to be the mean vector of the original ones extracted from the FCGS. In such a manner, the vectors in $\mathcal{Z}$ denote more accurately the original grasps in which they are originated from.

After acquiring a set of vectors that are common to two or more of the sets $\varepsilon_1, \ldots, \varepsilon_q$, a classification procedure is performed in order to determine the minimal number of grasp configurations that can grasp subsets of the parts. This is done using a classification algorithm, as discussed below.

As registry set $\mathcal{Z} \in \mathbb{R}^d$ has already been acquired, the method proceeds to classify the set of objects to a minimal number of subsets, where each subset can be grasped by its respective grasp configuration.

Definition 2: A subset of vectors $\mathcal{H} \subseteq \mathcal{Z}$ is said to cover all the primitive sets $\varepsilon_1, \ldots, \varepsilon_q$, if there exists $u_1, \ldots, u_\sigma \in \mathcal{H}$ such that for each $\varepsilon_i$, where i=1, ..., q, there exist at least one $u_j \in \varepsilon_i$ for some $j \in [1, \sigma]$.

The d-dimensional registry set $\mathcal{Z}$ acquired in the previous algorithms contains the vectors $u_1, \ldots, u_m \in \mathcal{Z}$ that are common to two or more sets of $\varepsilon_1, \ldots, \varepsilon_q$. A compatible set $\tilde{u}_1, \ldots, \tilde{u}_m \in \mathcal{U}_q$ affiliates the vectors in $\mathcal{Z}$ to the FCGS which they exist in. $\tilde{u}_i$ is a q sized binary vector consisting "one" in component j if $u_i$ exists in $\varepsilon_j$ and "zero" if not. The next step is to classify all the vectors in set $\mathcal{Z}$ to get a minimum subset of vectors $\mathcal{H} \subseteq \mathcal{Z}$ which covers all the primitive sets $\varepsilon_1, \ldots, \varepsilon_q$. That is, classify the objects to a minimal number of subsets with its compatible common grasp for each subset.

Given that a vector $u_i \in \mathcal{Z}$ and its compatible binary vector $\tilde{u}_i \in \mathcal{U}_q$ consisting one's or zero's, it can be said that a subset $\mathcal{H} \subseteq \mathcal{Z}$ where $u_1, \ldots, u_\sigma \in \mathcal{H}$, covers $\varepsilon_1, \ldots, \varepsilon_q$ if:

$$\vee_{j=1}^{\sigma} \tilde{u}_j = (\vec{1})_{q \times 1} \quad (34)$$

It is in fact desired to find a minimal number of binary vectors where their unification equals to a vector of ones. That is, a minimal number of grasps that can grasp all the various parts 120 (of FIG. 7). More specifically, the method finds a solution where the number of grasps σ is minimal, preferably a solution with one grasp for all objects. If a point $u_1$ in the set Z is found while its corresponding vector $\tilde{u}_i$ satisfies condition (34), it means that $\tilde{u}_1 = (1, 1, \ldots, 1)^T$, or in simple words, that there is one grasp (defined by feature vector $u_1$) which is common to all sets. If a number of vectors is needed (σ>1) to cover the FCGS, it means that the set of objects is divided into σ subsets and each vector is in fact a grasp suitable to the specific subset of objects (see Example 3 below). The method finally results in obtaining σ grasps for q parts divided into σ subsets according to the compatible grasp. Algorithm 7 presents a function Classification, which receives the set $\mathcal{Z}$ and searches for the minimal number of vectors that satisfies condition (34). Sometimes it is possible to find more than one set of vectors that cover the FCGS, therefore, the function returns the set of vectors which have the maximum grasp quality.

---
Algorithm 7-Function Classification($\mathcal{Z}$)
---

INPUT: Registry set $\mathcal{Z}$.
OUTPUT: One or more common grasps.
1.    σ = 1
2.    while σ < size($\mathcal{Z}$) do
3.      Find all possible combinations $\mathcal{H}_j = (u_1, \ldots, u_\sigma)$ in $\mathcal{Z}$ which satisfy $\bigvee_{i=1}^{\sigma} \tilde{u}_i = (\vec{1})_{q \times 1}$ 4.      if success then
5.        Calculate $Q_j = \min_Q(u_1, \ldots, u_\sigma)$ of each $\mathcal{H}_j$.
6.        return $\mathcal{H}_j$ satisfying $\arg\max_{\mathcal{H}_j} Q_j(\mathcal{H}_j)$ // return the grasp with the highest quality measure.
7.      else
8.        σ = σ + 1
9.      end if
10.   end while
11.   return NULL // there is no common grasp.

EXAMPLE 3

Given that registry set $\mathcal{Z}$ contains five feature vectors $u_1, \ldots, u_5 \in \mathcal{U}_q$ that are common to two or more sets of $\varepsilon_1, \varepsilon_2, \varepsilon_3, \varepsilon_4$ (q=4 parts). After the performance of function Join-FCGS on $\varepsilon_1, \ldots, \varepsilon_4$, each vector $u_j$ is affiliated to a binary vector $\tilde{u}_j$. For example, the five outputted binary vectors are shown in (35).

$$\tilde{u}_1 = \begin{pmatrix} 1 \\ 0 \\ 0 \\ 1 \end{pmatrix} \quad (35)$$

$$\tilde{u}_2 = \begin{pmatrix} 0 \\ 1 \\ 0 \\ 1 \end{pmatrix}$$

$$\tilde{u}_3 = \begin{pmatrix} 0 \\ 1 \\ 1 \\ 1 \end{pmatrix}$$

$$\tilde{u}_4 = \begin{pmatrix} 1 \\ 0 \\ 1 \\ 0 \end{pmatrix}$$

$$\tilde{u}_5 = \begin{pmatrix} 1 \\ 1 \\ 1 \\ 1 \end{pmatrix}$$

For instance, binary vector $\tilde{u}_1$ has 1's in the first and fourth position. Therefore, the respective feature vector $u_1$ exists in FCGS $\varepsilon_1$ and $\varepsilon_4$, meaning that the corresponding grasp configuration can grasp objects 1 and 4. Binary vector $\tilde{u}_5$ equals to $(\vec{1})$ and therefore, it corresponds to grasp configuration which can grasp all the objects. If such a single binary vector $\tilde{u}_5$ which satisfies condition (33) does not exist, it would be desired to search for the minimal set of binary vectors satisfying the condition. In this example, vectors $\tilde{u}_2$ and $\tilde{u}_4$ are taken, where their union results in $(\vec{1})$. Therefore, classify the set of objects are classified to subsets, grasp 2 corresponds to grasp configuration $u_2$ and will grasp objects 2 and 4. Grasp 4 corresponds to grasp configuration $u_4$ and will grasp objects 1 and 3. Moreover, overlapping may occur, such as the union of and $\tilde{u}_3$ which in fact results in the possibility of both grasp configurations to grasp object 4. In such a case, object 4 will be grasped by the highest quality grasp of the two. In the classification process the parts are divided into classes, where each class has its own grasp configuration.

The main algorithm for finding common grasp of a set of objects is given in Algorithm 8:

---
ALGORITHM 8
---

Common grasp search (CAD model of q objects)
    INPUT: 3D CAD's of objects $B_1, \ldots, B_q$.
    OUTPUT: A common grasp for all objects or common grasps for subsets of the objects.

1.   for i = 1 → q do
2.     Mesh object $B_i$.
3.     Manually label forbidden grasp regions on mesh of object $B_i$.
4.     Generate set $\varepsilon_i$ using Algorithm 3.
5.   end for
6.   Z = JoinFCGS ($\varepsilon_1, \ldots, \varepsilon_q$) using Algorithm 4.
7.   $\mathcal{H}$ = Classification($\mathcal{Z}$) using Algorithm 7.
8.   return $\mathcal{H} = (u_1, \ldots, u_k)$ Algorithm 8 begins with meshing of each of the existing parts, and by marking of forbidden zones by the user. After the mesh is completed, the generation of the FCGS procedure is performed, for example, according to Algorithm 3. Next, the similarity join is performed according to Algorithm 4 in order to build the registry set $\mathcal{Z}$. Finally, the classification procedure is performed, for example, according to Algorithm 7, which in turn outputs the best grasp or grasps that are common to all of the objects.

Upon completion of the method of the invention, if a solution of a single common grasp or a set of common grasps at the vertices of the objects' meshes exists, the algorithm finds it. If, however, no solution exists, the method reports that no common grasp points exit for all the existing parts. Obviously, in order to overcome this latter case, one or more grasp points may be added to the existing solution, or the method may be repeated by increasing the available number n of gripping points.

As shown, the method of the present invention maps all the possible grasps (up to mesh size) to determine only the feasible ones. The feasible grasps are those that are force-closure and has a quality measure greater than a pre-defined lower bound. The feasible grasps are parameterized to a feature vector in the feature space, injectively representing the grasp configuration as a polytope with no reference to any coordinate frame. The feature vectors are added to a set denoted as FCGS of the compatible part. Once all feasible grasps of all parts are mapped to the FCGS sets, a Nearest Neighbor Search is performed to find pairs of common vectors among the sets. Those pairs that are found are checked to satisfy tolerance demands, and are further added to a registry set of common vectors. A classification procedure is then performed to find the minimum set of vectors from the registry set that covers all of the FCGS sets. The set of feature vectors found in fact provides those common grasps of subsets that are suitable to all the parts. The algorithm aims to find a single vector which exists in all of the FCGS or a minimal set of vectors for subsets of parts. The vectors found are in fact the grasp configurations that are able to grasp the compatible subset of parts. As the method of the invention goes through all the possible n-finger grasp combinations (up to the mesh size), the method certainly results in the determination of a common grasp or a set of common grasps if such exist. Thus, if a single grasp for all given parts or a set of grasps for subsets of the parts exist, the method of the invention will result in determination of them.

Simulation

A simulation of the method of the invention was implemented in Matlab on an Intel-Core i7-2620M 2.7 GHz laptop computer with 8 GB of RAM. The running of the algorithm was performed using MATLAB parallel computing toolbox in order to decrease runtime. The following simulations present an example of the algorithm operation on 3-clamping frictional grasps of four sheet metal doors.

Figure 9:
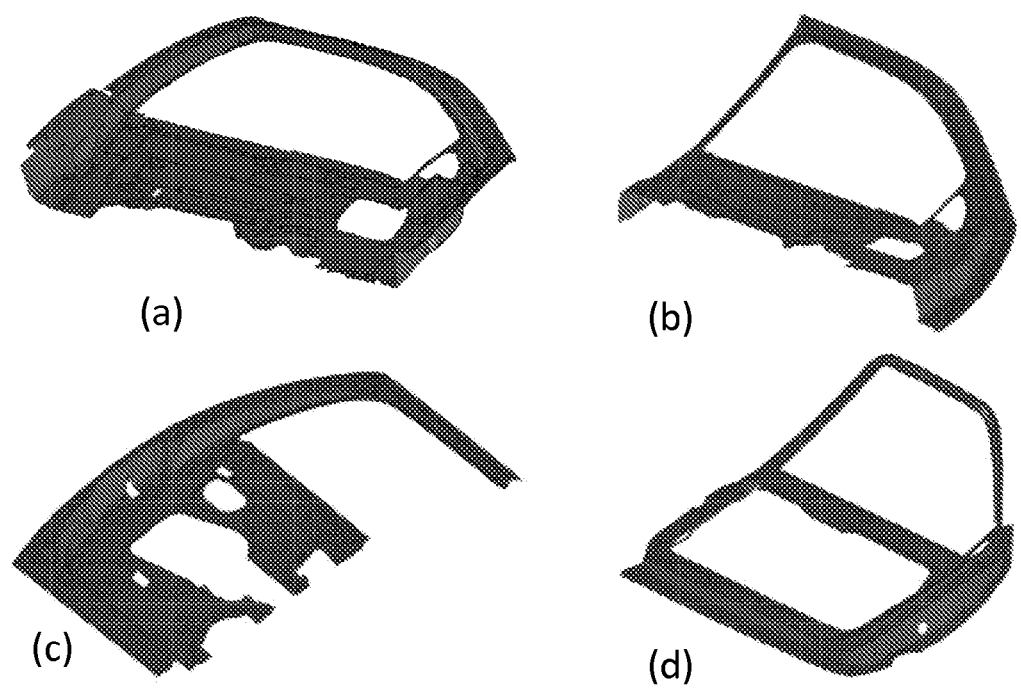
FIG. 9 shows four sheet metal parts—marked as (a), (b), (c), and (d), that were tested using the algorithm of the invention.
Figure 10:
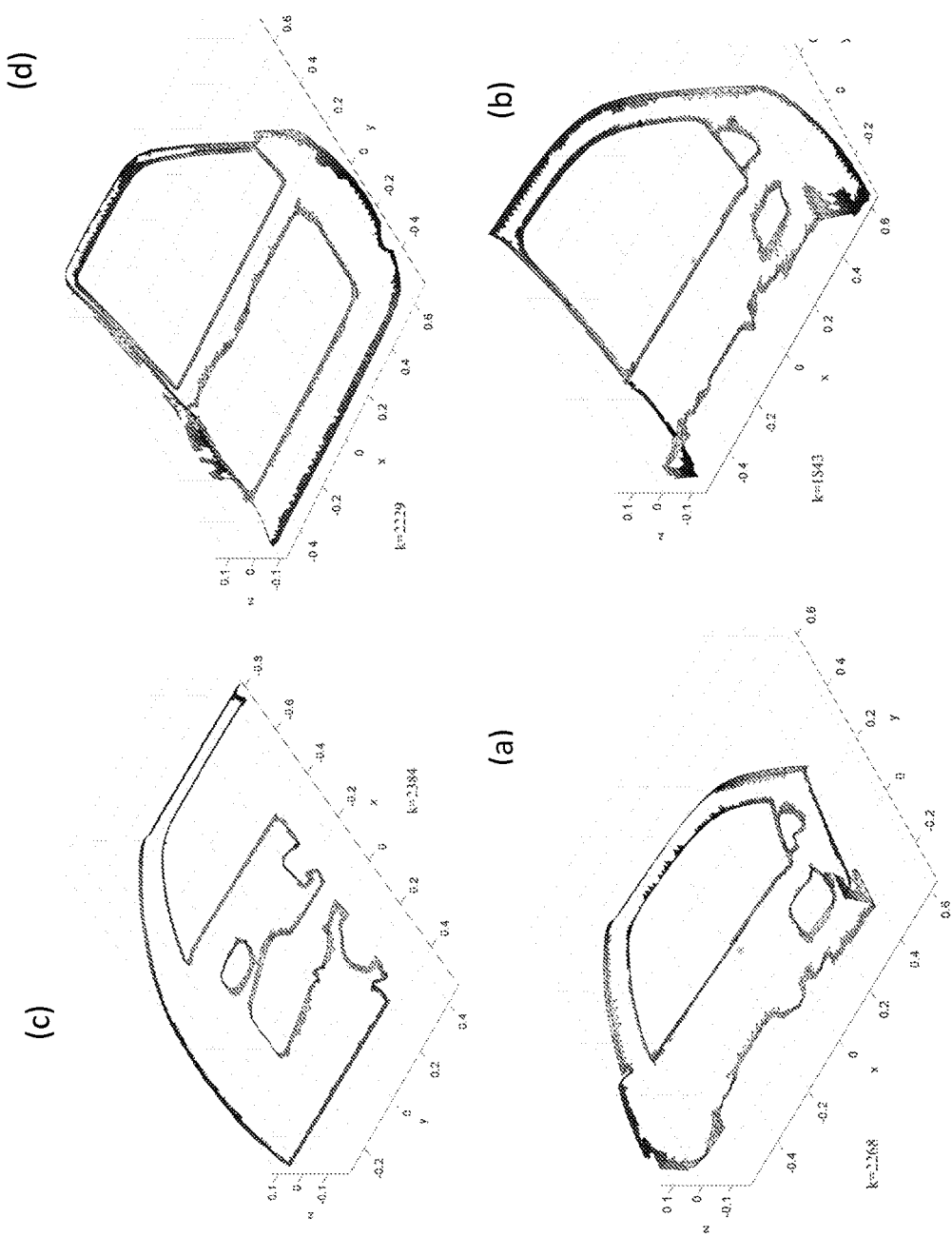
FIG. 10 shows the parts of FIG. 9 respectively, as meshed on their edges using COMSOL Multiphysics to triangular meshes (after mesh reduction)
Figure 11:
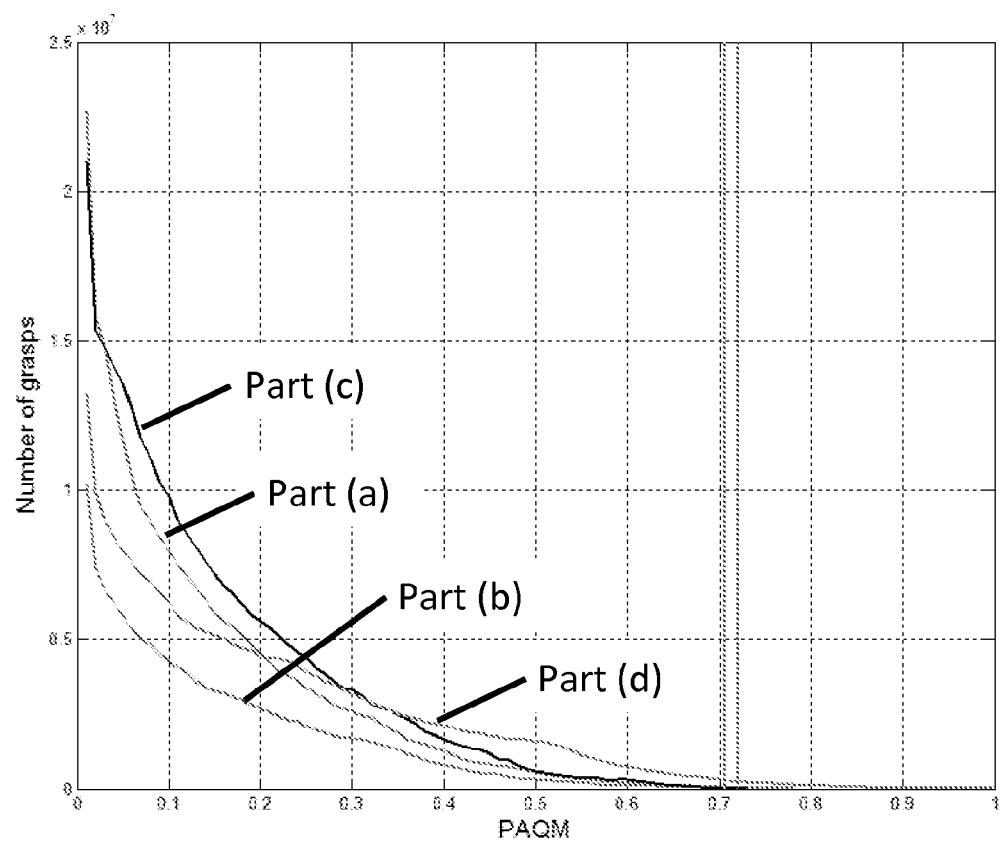
FIG. 11 shows a distribution of grasps with respect to their PAQM, and an allowable grasps range to be sampled.

Four sheet metal parts that are marked as (a), (b), (c), and (d) on FIG. 9 were tested using the algorithm of the invention. Said parts were meshed on their edges using COMSOL Multiphysics to triangular meshes of size 1843 to 2384 triangles as illustrated on FIG. 10 (the triangles are not clearly seen, in view of the high resolution of the mesh). The algorithm was implemented with a 3-clamping frictional grasp. For the generation of the FCGS, the construction of the grasp feature vector was performed according to algorithm 1 and as described in example 2. The boundaries of the PAQM were calculated according to condition 31 to be $Q_{min}=0.7098$ and $Q_{max}=0.7202$. FIG. 11 presents the distribution of the grasps with respect to their PAQM and the allowable range to be sampled to the FCGS. The figure shows 4 distribution curves, one for each part.

Figure 12:
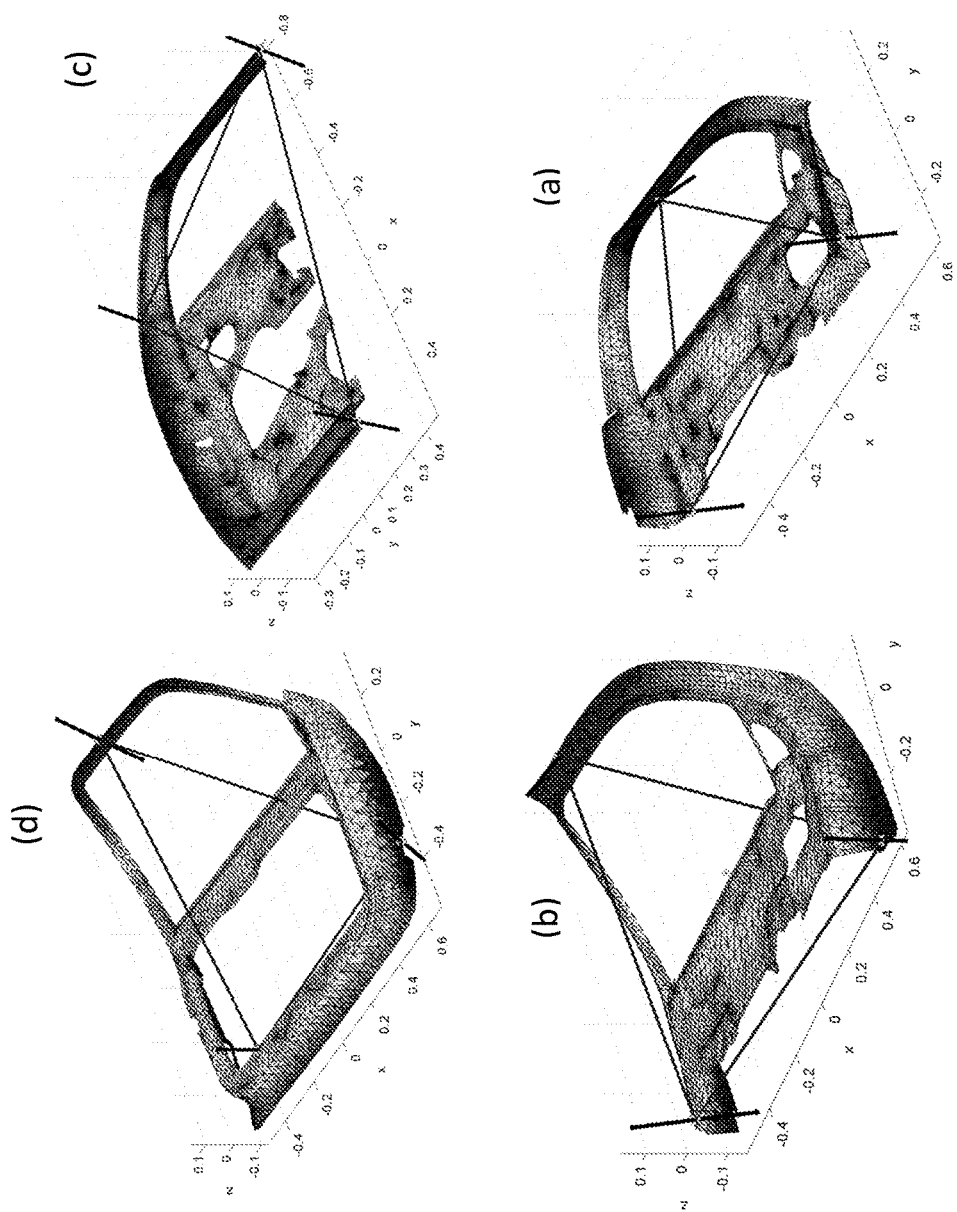
FIG. 12 shows a best selected grasp configuration, out of 6 possible common grasps that were found in an exemplary case.

For the similarity search algorithm, the tolerances of the triangles shape $\varepsilon_1$[mm], $\varepsilon_2$ [mm], $\varepsilon_3$ [°] were chosen so that the edges will not extend more than 4% of their original length. The parameters to compare (with condition (33)) normals at the contact points are $\alpha=0.8$ (80% of the friction angle) and $\mu=0.6$. The search algorithm provided 6 grasps that are common to all parts. The output of the algorithm was one grasp of the 6 with the highest quality measure. FIG. 12 presents the best grasp configuration out of the 6 found common grasps. The best grasp has a quality measure of $Q=0.7175$. This resulted grasp configuration is the best common 3-clamps grasp for the four tested parts.

While some embodiments of the invention have been described by way of illustration, it will be apparent that the invention can be carried out with many modifications variations and adaptations, and with the use of numerous equivalents or alternative solutions that are within the scope of persons skilled in the art, without departing from the spirit of the invention or exceeding the scope of the claims.

The invention claimed is:

1. An end effector of a robot for real-world grasping or manipulating of a plurality of different parts, each part having its own geometry, comprising:
   a) one of more gripping elements which are individually actuated to exert a force at a corresponding contact point associated with each of said parts by a common grasp which is the same for all of said parts, one part at a time; and
   b) a processor in data communication with an actuator of each of said one or more gripping elements and which is operable to determine said common grasp,
   wherein said common grasp is based on a determination of all possible grasps that are capable of holding a respective part by any n-contact points, a quality measure for each of said possible grasps, an allowable range for said determined quality measures, a feature vector that parameterizes each of the grasps that are found to be within said allowable range for each of said parts, a cross-part intersection between the grasps that are found to be within said allowable range, and a single grasp having a highest quality measure among said intersected grasps,
   wherein said quality measure relies on a distribution of a projection of the contact points on a plane fitted to these contact points, while the quality measure is defined as an area of a convex polygon formed by said projection.

2. The end effector of claim 1, wherein the processor is operable to determine the allowable range for said determined quality measures as based on a distribution graph.

3. The end effector of claim 1, wherein the processor is operable to construct the feature vector with 5n–6 or more-dimensions for an n-points grasp.

4. The end effector of claim 1, wherein the processor is operable to base the single common grasp on an increased number of gripping points n=n+1 when the cross-art intersection results in a null number of grasps.

5. The end effector of claim 1, wherein the processor is operable to consider each of said cross-part intersections within a predefined range.

6. The end effector of claim 1, wherein the processor is operable to define a larger area of the convex polygon formed by the projection as a higher quality measure and a better grasp.

7. The end effector of claim 1, wherein the one or more gripping elements are individually actuated to exert a force at a corresponding contact point associated with a specific class of the parts by a grasp common to the parts of the specific class if no common grasp is found for all of said plurality of parts.

8. The end effector of claim 1, which is provided at an end of a robot arm.

9. The end effector of claim 1, wherein each contact point comprises an actuated clamp.

* * * * *